US009842962B2

United States Patent
Woo et al.

(10) Patent No.: US 9,842,962 B2
(45) Date of Patent: Dec. 12, 2017

(54) NANOSTRUCTURED HYBRID PARTICLE, MANUFACTURING METHOD THEREOF, AND DEVICE INCLUDING THE NANOSTRUCTURED HYBRID PARTICLE

(71) Applicant: KOREA INSTITUTE OF SCIENCE AND TECHNOLOGY, Seoul (KR)

(72) Inventors: Kyoungja Woo, Seoul (KR); Hyein Yoo, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/737,464

(22) Filed: Jun. 11, 2015

(65) Prior Publication Data

US 2016/0300981 A1 Oct. 13, 2016

(30) Foreign Application Priority Data

Apr. 8, 2015 (KR) ........................ 10-2015-0049958

(51) Int. Cl.
  *H01L 29/06* (2006.01)
  *H01L 31/00* (2006.01)
  (Continued)

(52) U.S. Cl.
  CPC ............... *H01L 33/06* (2013.01); *G01J 1/42* (2013.01); *G01J 3/50* (2013.01); *G01J 5/60* (2013.01);
  (Continued)

(58) Field of Classification Search
  CPC ......... H01L 33/00; H01L 33/06; H01L 33/52; H01L 31/18; H01L 51/44; H01L 51/00
  (Continued)

(56) References Cited

U.S. PATENT DOCUMENTS 6,114,038 A * 9/2000 Castro ...................... B82Y 5/00
                                                   257/614
7,297,405 B2 * 11/2007 Kohno ...................... B03C 1/01
                                                   427/220

(Continued)

FOREIGN PATENT DOCUMENTS

CN    105917418 A  *  8/2016 ............... H01B 1/22
EP    2 818 868 A1     12/2014
(Continued)

OTHER PUBLICATIONS

English Translation of Foreign Patent KR20100100560, Cho Myung Je, Date: Sep. 2010.*
(Continued)

*Primary Examiner* — Sheikh Maruf
(74) *Attorney, Agent, or Firm* — Goldilocks Zone IP Law

(57) ABSTRACT

A nanostructured hybrid particle, a manufacturing method thereof, and a device including the nanostructured hybrid particle are disclosed. The nanostructured hybrid particle includes a hydrophobic base particle having a convex-concave nanopattern on a surface thereof; a hydrophobic light-emitting nanoparticle disposed in a concave portion of the convex-concave nanopattern on the surface of hydrophobic base particle; and a coating layer covering the hydrophobic base particle and the hydrophobic light-emitting nanoparticle. In the nanostructured hybrid particle, light extraction may occur in all 3-dimensional directions, and thus, the nanostructured hybrid particle can exhibit high light extraction efficiency compared to light extraction occurring on a two-dimensional plane.

20 Claims, 16 Drawing Sheets

(51) Int. Cl.
*H01L 29/08* (2006.01)
*H01L 33/00* (2010.01)
*H01L 33/06* (2010.01)
*G01J 5/60* (2006.01)
*G01J 3/50* (2006.01)
*G01J 1/42* (2006.01)
*H01L 33/50* (2010.01)

(52) U.S. Cl.
CPC .......... *H01L 33/002* (2013.01); *H01L 33/005* (2013.01); *H01L 33/0025* (2013.01); *H01L 33/0029* (2013.01); *H01L 33/0066* (2013.01); *H01L 33/0087* (2013.01); *H01L 33/502* (2013.01)

(58) Field of Classification Search
USPC .................. 257/13, 98, 14, 104, 79; 438/22
See application file for complete search history.

(56) References Cited

U.S. PATENT DOCUMENTS

| | | | |
|---|---|---|---|
| 2003/0020060 A1* | 1/2003 | Iwasaki | B82Y 10/00 257/13 |
| 2006/0148104 A1* | 7/2006 | Marini | B82Y 5/00 436/524 |
| 2006/0228554 A1* | 10/2006 | Tan | A61K 49/183 428/404 |
| 2007/0059705 A1* | 3/2007 | Lu | B82Y 15/00 435/6.11 |
| 2007/0190365 A1* | 8/2007 | Kodama | B82Y 10/00 428/832 |
| 2007/0269380 A1* | 11/2007 | Zhang | A61K 31/4985 424/9.32 |
| 2008/0213377 A1* | 9/2008 | Bhatia | A61K 47/48238 424/489 |
| 2009/0101875 A1* | 4/2009 | Boyden | G03C 1/731 252/600 |
| 2009/0258076 A1* | 10/2009 | Cheon | A61K 41/0042 424/491 |
| 2009/0280327 A1* | 11/2009 | Ying | B82Y 10/00 427/127 |
| 2009/0322327 A1* | 12/2009 | Gao | B82Y 5/00 324/307 |
| 2010/0255103 A1* | 10/2010 | Liong | A61K 9/5094 424/489 |
| 2011/0022129 A1* | 1/2011 | Prud'homme | A61K 9/0009 607/88 |
| 2011/0117637 A1* | 5/2011 | Gray | G01N 21/6452 435/287.2 |
| 2011/0135729 A1* | 6/2011 | Cheon | A61K 41/0052 424/484 |
| 2011/0222179 A1* | 9/2011 | Monadgemi | B29D 11/00596 359/850 |
| 2011/0257040 A1* | 10/2011 | Turner | B01J 19/0046 506/16 |
| 2011/0274832 A1* | 11/2011 | Dai | C23C 18/1212 427/127 |
| 2011/0288234 A1* | 11/2011 | Pandey | A61K 49/0032 525/54.1 |
| 2012/0077021 A1* | 3/2012 | Nayfeh | B82Y 25/00 428/323 |
| 2012/0207795 A1* | 8/2012 | Zink | A61K 9/0019 424/400 |
| 2012/0319030 A1 | 12/2012 | Cho et al. | |
| 2013/0299796 A1* | 11/2013 | Masuyama | B29C 33/3857 257/40 |
| 2013/0319522 A1* | 12/2013 | Koike | H01L 31/02366 136/256 |
| 2014/0264269 A1* | 9/2014 | Choi | C09K 11/54 257/13 |
| 2015/0076392 A1* | 3/2015 | Fu | A61K 49/0002 252/62.51 R |
| 2015/0212095 A1* | 7/2015 | Fu | G01N 33/54326 435/7.92 |
| 2016/0028031 A1* | 1/2016 | Nakayama | H01L 51/0096 438/32 |
| 2016/0116464 A1* | 4/2016 | Stayton | A61K 49/1839 435/5 |
| 2016/0146819 A1* | 5/2016 | Ince | G01N 33/743 514/167 |

FOREIGN PATENT DOCUMENTS

| | | |
|---|---|---|
| JP | 2001-323262 A | 11/2001 |
| KR | 10-2010-0100560 A | 9/2010 |
| KR | 10-2012-0119162 A | 10/2012 |

OTHER PUBLICATIONS

English Translation of Foreign Patent KR20120119162, , Choi Yun Sik, Date : Oct. 2012.*
CN 105917418 A English translation, Uenoyama, Shinya; (JP). Wang, Xiaoge; (JP). Mahara, Shigeo; (JP) , Aug. 1, 2014.*
Yoo et al. The Preparation of Core-Shell Magnetic Silica Nanospheres for Enhancing Magnetism and Fluorescence Intensity, Journal of Nanoscience and Nanotechnology, 2013, pp. 7615-7619 , vol. 13.
Li et al., Stable and water-soluble CdTe@SiO2 composite nanospheres:Preparation, characterization and application in LED, Colloids and Surfaces A: Physicochem. Eng. Aspects 424, Feb. 27, 2013, pp. 33-39, Elsevier.
Ran et al., Silica/CdTe/silica fluorescent composite nanoparticles via electrostatic assembly as a pH ratiometer, RSC Advances, 2014, pp. 37921-37927,vol. 4, Royal society of chemistry.
Chen et al., Multifunctional Mesoporous Nanoellipsoids for Biological Bimodal Imaging and Magnetically Targeted Delivery of Anticancer Drugs, Advanced functional materials, 2011. pp. 270-278 , vol. 21, Materials views.
Hu et al. Mesoporous silica nanospheres decorated with CdS nanocrystals for enhanced photocatalytic and excellent antibacterial activities, Nanoscale, 2013, pp. 6327-6332, vol. 5, RSC publishing.
Hu et al. Silica-based hybrid microspheres: synthesis, characterization and wastewater treatment, RSC Advances, 2013, pp. 25620-25626 , vol. 3, RSC publishing.
Hu et al. Synthesis of Mesoporous SiO2@TiO2 Core/Shell Nanospheres with Enhanced Photocatalytic Properties, Part. Syst. Charact., 2013, pp. 306-310, vol. 30, Materials views.
Communication dated Dec. 22, 2015 of the German patent application No. 10 2015 109 947.0, which corresponds to above identified application.
Fujii et al., Increase in the extraction efficiency of GaN-based light-emitting diodes via surface roughening, Applied Physics letters, Feb. 9, 2004, pp. 855-857.vol. 84.No. 6, AIP Publishing, USA.
Jung et al.,Enhanced Light Output from the Nano-Patterned InP Semiconductor Substrate Through the Nanoporous Alumina Mask, Journal of Nanoscience and Nanotechnology, J. 2012, vol. 12, No. 7, pp. 5747-5753, American Scientific Publishers, Korea.
Communications of Korean Office Action dated Aug. 23, 2016 of Korean Patent Application No. 10-2015-0049958, which corresponds to this application.

* cited by examiner

NANOSTRUCTURED HYBRID PARTICLE, MANUFACTURING METHOD THEREOF, AND DEVICE INCLUDING THE NANOSTRUCTURED HYBRID PARTICLE

CROSS-REFERENCE TO RELATED APPLICATION

This application claims the benefit of Korean Patent Application No. 10-2015-0049958, filed on Apr. 8, 2015, in the Korean Intellectual Property Office, the disclosure of which is incorporated herein in its entirety by reference.

BACKGROUND

1. Field

One or more exemplary embodiments relate to a novel nanostructured hybrid particle that increases light extraction efficiency thereof, a method of manufacturing the nanostructured hybrid particle, and a device including the nanostructured hybrid particle.

2. Description of the Related Art

Research into light-emitting apparatuses, e.g., light-emitting diodes (LEDs) or photonic devices, is being actively conducted in consideration of economic effects that are improved in accordance with an increase in light extraction efficiency. In addition, since a biosensor or a bio-imaging material has good sensitivity in accordance with high light extraction efficiency, the biosensor or the bio-imaging material may be used to obtain an accurate diagnosis. It is known that, when a nanostructure that repeats a pattern with dimensions from tens of nanometers to hundreds of nanometers on a surface of a GaN semiconductor constituting an LED is prepared, a ratio of light reflection into an interior of the LED is reduced while a ratio of light emission to an outside of the LED is increased, thereby increasing the light extraction efficiency (refer to Applied Physics Letters 2004, 84, 855-857). It is also known that, when a coating layer having a lower refractive index than that of a GaN semiconductor substrate is formed on a GaN semiconductor substrate with patterns, a refractive index difference between the coating layer and air becomes small, thereby increasing the light extraction efficiency (refer to Journal of Nanoscience and Nanotechnology 2012, 12, 5747-5753).

As such, research into increasing the light extraction efficiency is associated intensively with a two-dimensional (2D) surface of a light-emitting apparatus, e.g., an LED, a solar cell, or a display device, especially with a 2D surface of a semiconductor substrate having a size of tens of nanometers×tens of nanometers. Here, such a 2D surface of a semiconductor substrate is patterned according to an etching method, e.g., photolithography or plasma etching. That is, a 2D surface of a semiconductor substrate may include repeated nanopatterns with dimensions of hundreds of nanometers. Meanwhile, there are difficulties in manufacturing nanopatterns with dimensions of 100 nm or less, and such nanopatterns have low productivity yields.

There has been no disclosure of manufacturing nanopatterns on a surface of an independent semiconductor particle with dimensions from nanometers to micrometers, wherein dimensions of the nanopatterns are much smaller independent semiconductor particle, or manufacturing nanopatterns to be coated with a material having a low refractive index. In addition, there have been no known effects of nanopatterns that are formed on particles with dimensions from nanometers to micrometers.

SUMMARY

One or more exemplary embodiments include a nanostructured hybrid particle having high light extraction efficiency.

One or more exemplary embodiments include a method of manufacturing the nanostructured hybrid particle.

One or more exemplary embodiments include a device including the nanostructured hybrid particle.

Additional aspects will be set forth in part in the description which follows and, in part, will be apparent from the description, or may be learned by practice of the presented embodiments.

According to one or more exemplary embodiments, a nanostructured hybrid particle may include: a hydrophobic base particle having a convex-concave nanopattern on a surface thereof; and a hydrophobic light-emitting nanoparticle disposed in a concave portion of the convex-concave nanopattern on the surface of the hydrophobic base particle.

In an exemplary embodiment, the base particle of the nanostructured hybrid particle may include at least one selected from silica, alumina, titania, zirconia, and ceria.

In an exemplary embodiment, the light-emitting nanoparticle of the nanostructured hybrid particle may include at least one selected from a semiconductor nanocrystal, an inorganic fluorophore, a fluorescent dye, and a transparent metal oxide doped with a dye.

In an exemplary embodiment, the light-emitting nanoparticle of the nanostructured hybrid particle may include hydrophobic ligand or a surfactant having a hydrophobic functional group on a surface thereof.

In an exemplary embodiment, the nanostructured hybrid particle may further include at least one metal nanoparticle selected from gold (Au), silver (Ag), iron (Fe), copper (Co), and nickel (Ni), in addition to the light-emitting nanoparticle in the concave portion of the convex-concave nanopattern.

In an exemplary embodiment, the nanostructured hybrid particle may further include a coating layer to cover the base particle and the light-emitting nanoparticle. The coating layer may include a material having a smaller refractive index than that of the light-emitting nanoparticle and a greater refractive index than that of air. For example, the material may include at least one selected from silica, alumina, titania, zirconia, and ceria, and may be combined with at least one functional group selected from a substituted or unsubstituted $C_6$-$C_{20}$ aryl group, a substituted or unsubstituted $C_1$-$C_{20}$ alkyl group, a substituted or unsubstituted $C_2$-$C_{20}$ alkenyl group, and a substituted or unsubstituted $C_2$-$C_{20}$ alkynyl group.

In an exemplary embodiment, the nanostructured hybrid particle may further include a core particle inside of the base particle, the core particle including: a cluster of superparamagnetic nanoparticles; and a shell surrounding the cluster and comprising at least one selected from silica, alumina, titania, zirconia, and ceria.

In an exemplary embodiment, a diameter of the nanostructured hybrid particle may be from about 10 nm to about 10 μm.

According to one or more exemplary embodiments, a method of manufacturing a nanostructured hybrid particle may include:

obtaining a hydrophobic base particle having a convex-concave nanopattern on a surface thereof by performing a sol-gel process between an alkoxide compound represented by Formula 1 below and an alkoxide compound represented by Formula 2; and disposing a hydrophobic light-emitting nanoparticle in a concave portion of the convex-concave structure on the surface of the base particle by mixing and stirring a mixture of a first solution in which the base particle is dispersed and a second solution in which the light-emitting nanoparticle is dispersed:

$$R^1M(OR^2)_m \qquad \text{<Formula 1>}$$

wherein, in Formula 1, M may be silicon (Si), aluminum (Al), titanium (Ti), zirconium (Zr), or cerium (Ce), $R^1$ may be a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_3$-$C_{20}$ heteroaryl group, a substituted or unsubstituted $C_4$-$C_{20}$ cycloalkyl group, or a substituted or unsubstituted $C_3$-$C_{20}$ heterocycloalkyl group, $R^2$ may be a linear or branched, substituted or unsubstituted $C_1$-$C_5$ alkyl group, and m may be an integer of 2 or greater, wherein m+1 denotes a valence of M,

$$M(OR^3)_m \qquad \text{<Formula 2>}$$

wherein, in Formula 2, M may be Si, Al, Ti, Zr, or Ce, $R^3$ may be a linear or branched, substituted or unsubstituted $C_1$-$C_5$ alkyl group, and m may denote a valence of M.

According to one or more exemplary embodiments, a light-emitting diode (LED) may include the nanostructured hybrid particle.

According to one or more exemplary embodiments, a biosensor may include the nanostructured hybrid particle.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
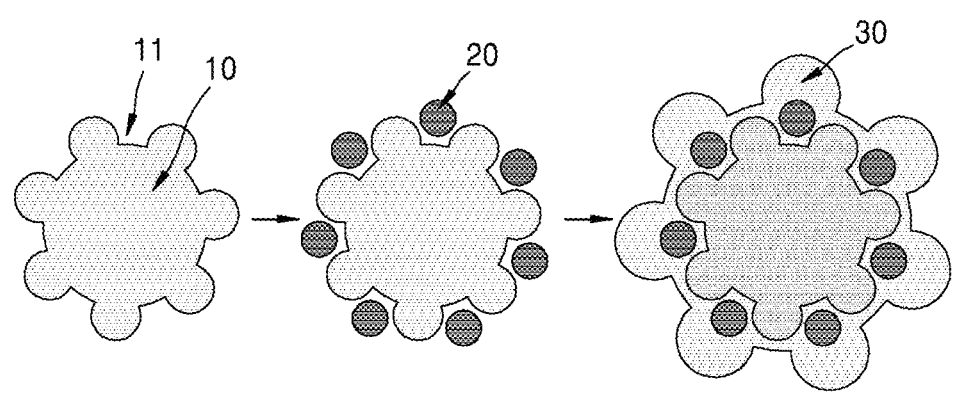
FIGS. 1A and 1B are each a diagram illustrating a structure of a nanostructured hybrid particle according to an exemplary embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

FIG. 1 is a diagram illustrating a schematic structure of a nanostructured hybrid particle according to an exemplary embodiment.

Referring to FIG. 1, the nanostructured hybrid particle includes a base particle 10 having a convex-concave nanopattern 11 on a surface thereof; and a light-emitting nanoparticle 20 disposed in a concave portion of the convex-concave nanopattern 11.

In the nanostructured hybrid particle, the light-emitting nanoparticle 20 is configured to be disposed on the base particle 10 having the nanopattern 11, thereby allowing light extraction in all three-dimensional directions. In this regard, the nanostructured hybrid particle may exhibit further increased light extraction efficiency, compared to a case of a two-dimensional semiconductor having a nanopattern on a surface thereof that allows light extraction in only one direction. In addition, due to the nanopattern on the surface, there is a limit in a contact area among neighboring particles in accordance with a weight of the particles, so as to prevent occurrence of cohesion among the neighboring particles.

The nanostructured hybrid particle having such a nanostructure may further increase emission intensity compared to that of referential light-emitting nanoparticles. The term "referential light-emitting nanoparticles" used herein refers to 'light-emitting nanoparticles used in manufacturing a nanostructured hybrid particle. That is, the emission intensity of the nanopattern hybrid particle integrated with the same number of referential light-emitting nanoparticles is further enhanced than that of the referential light-emitting nanoparticles without integration to the nanopattern hybrid particle.

Furthermore, as shown in FIG. 1, the nanostructured hybrid particle further includes a coating layer 30 to cover the base particle 10 and the light-emitting nanoparticles 20 by using a material having a low refractive index, thereby not only forming a safe structure of the nanostructured hybrid particle but also further increasing a light extraction efficiency. The term "a material having a low refractive index' used herein refers to a material having a relatively smaller refractive index than that of the light-emitting nanoparticle 20, and for example, a material having a smaller refractive index than that of the light-emitting nanoparticle 20 and a greater refractive index than that of air.

The base particle 10 may be formed of inorganic materials having a greater refractive index than that of air and a smaller refractive index of the light-emitting nanoparticles, and for example, the inorganic material may include at least one selected from silica, alumina, titania, zirconia, and ceria. However, the inorganic material is not limited thereto.

The base particle 10 may exhibit hydrophobic properties by combining a hydrophobic functional group with a surface of the base particle 10. That hydrophobic functional group may further include, for example, at least one selected from a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_3$-$C_{20}$ heteroaryl group, a substituted or unsubstituted $C_4$-$C_{20}$ cycloalkyl group, and a substituted or unsubstituted $C_3$-$C_{20}$ heterocycloalkyl group.

In the case of using a hydrophilic base particle of which a particle diameter is about 100 nm or less, a surface energy of the hydrophilic base particle is generally so high that the particles are severely aggregated with one another. In the case of using the hydrophobic base particle 10, the hydrophobic base particles 10 push one another due to van der Waals force. In addition, a contact area with neighboring particles is small based on a weight of the particle, and thus a colloidal solution having excellent dispersibility may be prepared.

Functional groups and substituents used in the present specification may be defined as follows.

The term "alkyl" used herein refers to a fully saturated branched or unbranched (or straight chain or linear) hydrocarbon.

Non-limiting examples of the "alkyl" include methyl, ethyl, n-propyl, isopropyl, n-butyl, isobutyl, sec-butyl, n-pentyl, isopentyl, neopentyl, iso-amyl, n-hexyl, 3-methylhexyl, 2,2-dimethylpentyl, 2,3-dimethylpentyl, n-hepthyl, and n-octadecyl.

At least one hydrogen of the "alkyl" may be substituted with a halogen atom, a $C_1$-$C_{20}$ alkyl group substituted with a halogen atom (e.g., $CCF_3$, $CHCF_2$, $CH_2F$, or $CCl_3$), a $C_1$-$C_{20}$ alkoxy group, a $C_2$-$C_{20}$ alkoxyalkyl group, a hydroxyl group, a nitro group, a cyano group, an amino group, an amidino group, a hydrazine, a hydrazine, a carboxyl group or a salt thereof, a sulfonyl group, a sulfamoyl group, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, a $C_7$-$C_{20}$ heteroarylalkyl group, a $C_6$-$C_{20}$ heteroaryloxy group, a $C_6$-$C_{20}$ heteroaryloxyalkyl group, or a $C_6$-$C_{20}$ heteroarylalkyl group.

The term "halogen atom" used herein refers to fluorine, bromine, chlorine, or iodine.

The term "alkoxy" used in chemical formulas represents alkyl-O—, wherein alkyl is as defined above. Non-limiting examples of the alkoxy include methoxy, ethoxy, propoxy, 2-propoxy, butoxy, tert-butoxy, pentyoxy, hexyloxy, cyclopropoxy, or cyclohexyloxy. At least one hydrogen of the alkoxy may be substituted with the same substituent used in the case of the alkyl group.

The term "alkoxyalkyl" used in chemical formulas refers to an alkyl group substituted with alkoxy. At least one hydrogen of the alkoxyalkyl may be substituted with the same substituent used in the case of the alkyl group. As such, the term "alkoxyalkyl" includes a substituted alkoxyalkyl moiety.

The term "alkenyl" used in chemical formulas refers to a branched or non-branched hydrocarbon containing at least one carbon-carbon double bond. Non-limiting examples of the alkenyl include vinyl, aryl, butenyl, isoprophenyl, or isobutenyl. At least one hydrogen of the alkenyl may be substituted with the same substituent used in the case of the alkyl group.

The term "alkynyl" used in chemical formulas refers to a branched or non-branched hydrocarbon containing at least one carbon-carbon triple bond. Non-limiting examples of the "alkynyl" include etylnyl, butynyl, isobutynyl, or an isopropynyl.

At least one hydrogen of the "alkynyl" may be substituted with the same substituent used in the case of the alkyl group.

The term "aryl" used in chemical formulas refers to an aromatic hydrocarbon containing at least one ring.

The term "aryl" used herein may also include a group in which an at least one aromatic hydrocarbon is fused with at least one cycloalkyl ring.

Non-limiting examples of the "aryl" include phenyl, naphtyl, or tetrahydronaphtyl.

In addition, at least one hydrogen of the "aryl" may be substituted with the same substituent used in the case of the alkyl group.

The term "arylalkyl" used herein may refer to an alkyl substituted with an aryl. An example of the arylakyl includes benzyl or phenyl-$CH_2CH_2$—.

The term "aryloxy" used in chemical formulas refers to —O-aryl, and an example thereof is phenoxy. At least one hydrogen of the "aryloxy" may be substituted with the same substituent used in the case of the alkyl group.

The term "heteroaryl" used in chemical formulas refers to a monocyclic or bicyclic organic compound containing at least one heteroatom selected from N, O, P, and S and carbon as the remaining ring atom. The heteroaryl group may include, for example, 1-5 heteroatoms and 5-10 ring members. Here, S or N may be oxidized to be in a variety of oxidation states.

At least one hydrogen of the "heteroaryl" may be substituted with the same substituent used in the case of the alkyl group.

The term "heteroarylalkyl" used herein refers to an alkyl substituted with an heteroaryl.

The term "heteroaryloxy" refers to a —O-heteroaryl moiety. At least one hydrogen of the "heteroaryloxy" may be substituted with the same substituent used in the case of the alkyl group.

The term "heteroaryloxyalkyl" used herein refers to an alkyl substituted with a heteroaryloxy. At least one hydrogen of the "heteroaryloxyalkyl" may be substituted with the same substituent used in the case of the alkyl group.

The term "cycloalkyl" used herein refers to a saturated or partially saturated non-aromatic monocyclic, bicyclic, or tricyclic hydrocarbon.

Examples of the monocyclic hydrocarbon include cyclopentyl, cyclohexyl, and cyclohexenyl, examples of the bicyclic hydrocarbon include bornyl, decahydronaphthyl, bicyclo[2.1.1]hexyl, bicyclo[2.2.1]heptyl, bicyclo[2.2.1]

heptenyl, and bicyclo[2.2.2]octyl, an example of the tricyclic hydrocarbon includes adamantly.

At least one hydrogen of the "cycloalkyl" may be substituted with the same substituent used in the case of the alkyl group.

The term "heterocycloalkyl" used herein refers to a saturated or partially saturated non-aromatic monocyclic, bicyclic, or tricyclic hydrocarbon containing at least one heteroatom selected from N, O, P, and S and carbon as the remaining ring atom. At least one hydrogen of the "heterocycloalkyl" may be substituted with the same substituent used in the case of the alkyl group.

The term "sufonyl" used herein refers to R"—$SO_2$—, wherein R" is hydrogen, alkyl, aryl, heteroaryl, aryl-alkyl, heteroaryl-alkyl, alkoxy, aryloxy, cycloalkyl, or heterocycloalkyl.

The term "sulfamoyl" used herein may include $H_2NS(O_2)$—, alkyl-$NHS(O_2)$—, $(alkyl)_2NS(O_2)$-aryl-$NHS(O_2)$—, alkyl-(aryl)-$NS(O_2)$—, $(aryl)_2NS(O)_2$, heteroaryl-$NHS(O_2)$—, (aryl-alkyl)-$NHS(O_2)$—, or (heteroaryl-alkyl)-$NHS(O_2)$—.

At least one hydrogen of the "sulfamoyl" may be substituted with the same substituent used in the case of the alkyl group.

The term "amino group" used herein refers to a case where a nitrogen atom is covalently bonded to at least one carbon or at least one heteroatom. Examples of the "amino group" include —NH2 and a substituted moiety. The amino group may also include "alkylamino" in which a nitrogen atom is bonded to at least one additional alkyl group, and "arylamino" and "diarylamino" to an aryl group in which one and two nitrogen atoms are bonded to an independently selected aryl group, respectively.

The light-emitting nanoparticle 20 may include at least one selected from the group consisting of a Group II-VI semiconductor nanocrystal, a Group III-V semiconductor nanocrystal, and inorganic fluorophore.

In an exemplary embodiment, the light-emitting nanoparticle 20 may have at least one core/shell structure selected from (1) to (3). In addition, the light-emitting nanoparticle 20 may further include an interlayer including an alloy of a core material and a shell material between a core and a shell:

(1) a Group II-VI semiconductor nanocrystal (core)/a Group II-VI semiconductor nanocrystal (shell), (2) a Group III-V semiconductor nanocrystal (core)/a Group III-V semiconductor nanocrystal (shell), and (3) a Group III-V semiconductor nanocrystal (core)/a Group II-VI semiconductor nanocrystal (shell).

In an exemplary embodiment, the Group II-VI semiconductor nanocrystal may include at least one selected from the group consisting of CdS, CdSe, CdTe, ZnS, ZnSe, ZnTe, HgS, HgSe, and HgTe, the Group III-V semiconductor nanocrystal may include at least one selected from the group consisting of GaN, GaP, GaAs, InP, and InAs, the fluorophore may include at least one selected from $La_2O_2S:Eu$, $Li_2Mg(MoO_4):Eu,Sm$, $(Ba, Sr)_2SiO_4:Eu$, $ZnS:Cu,Al$, $SrGa_2S_4:Eu$, $Sr_5(PO_4)_3Cl:Eu$, $(SrMg)_5PO_4Cl:Eu$, $BaMg_2Al_{16}O_{27}:Eu$, $Na(Y,Gd,Ln)F_4:(Yb,Er)$ (where Ln includes at least one lanthanoid, except Yb and Er), and the core/shell structure of $Na(Y,Gd,Ln)F_4:(Yb,Er)/Na(Gd,L)F_4:(Ce,Tb)$ (where L includes at least one lanthanoid or Y, except Yb, Er, Ce, and Tb).

An example of the Group II-VI semiconductor nanocrystal (core)/the Group II-VI semiconductor nanocrystal (shell) is CdSe/ZnS, an example of the Group III-V semiconductor nanocrystal (core)/the Group III-V semiconductor nanocrystal (shell) is InP/GaN, and an example of the Group III-V semiconductor nanocrystal (core)/the Group II-VI semiconductor nanocrystal (shell) is InP/ZnS, but the core/shell structure is not limited thereto.

The light-emitting nanoparticle 20 may include, on a surface thereof, a hydrophobic ligand or a surfactant having a hydrophobic group. Examples of the hydrophobic ligand or the surfactant having a hydrophobic group include R—$NH_2$, R—SH, R—$CO_2H$, $R_3$—P, and $R_3$—PO, wherein R may be a $C_8$-$C_{20}$ alkyl chain, but the hydrophobic ligand or the surfactant having a hydrophobic group is not limited thereto.

The light-emitting nanoparticle 20 may be, for example, a quantum dot synthesized in a non-polar organic solvent, and such a synthesized quantum dot may have excellent optical characteristics in terms of quantum efficiency and emission intensity. In addition, such a synthesized quantum dot may have a structure configured by hydrophobic surfactants or hydrophobic ligands that protect a surface of the quantum dot for prevention of quantum dot aggregation. That is, a polar portion of the surfactant or ligand is combined with a surface of the light-emitting nanoparticle 20 while a non-polar carbon chain is exposed outside of the surfactant, thereby exhibiting hydrophobicity. In addition, particles push one another due to van der Waals force therebetween, and thus a colloidal solution having excellent dispersibility may be prepared.

As such, the hydrophobic light-emitting nanoparticle 20 may be self-assembled to be disposed in a concave portion of the convex-concave nanopattern on the surface of the hydrophobic base particle 10 in a solution. Once the light-emitting nanoparticle 20 is disposed in the concave portion on the surface of base particle 10, for example, a surface of a long carbon chain of the light-emitting nanoparticle 20 and a surface of a long carbon chain of the base particle 10 may be engaged with one another for fixation in the way of interdigitating one's fingers. When the light-emitting nanoparticle 20 is caught in the concave portion of the convex-concave nanopattern on the surface of the hydrophobic base particle 10, due to a Van der Waals force, a contact surface area in the concave portion is expanded so that the light-emitting nanoparticle 20 cannot easily escape from the concave portion of the convex-concave nanopattern. In addition, such a self-assembled structure of the light-emitting nanoparticle 20 on the nanopattern of the hydrophobic base particle 10 may provide the light-emitting nanoparticle 20 light extraction efficiency that is at least twice or three times as large as that of a standard light-emitting nanoparticle of the same concentration.

In an exemplary embodiment, in the concave portion of the convex-concave nanopattern 11, a metal nanoparticle including at least one selected from Au, Ag, Fe, Co, and Ni may be further disposed in addition to the light-emitting nanoparticle 20. When the light-emitting nanoparticle 20 is mixed with the metal nanoparticle, such as a gold nanoparticle, the fluorescence of the light-emitting nanoparticle 20 may be further enhanced by the plasmon effect.

In an exemplary embodiment, the light-emitting nanoparticle 20 caught in the concave portion of the convex-concave nanopattern 11, or the combination of the light-emitting nanoparticle 20 and the metal nanoparticle may be further coated with a low refractive index material to form a coating layer 30. The low refractive index material used herein refers to a material having a smaller refractive index than that of the light-emitting nanoparticle 20 and a greater refractive index than that of air. The coating layer 30 may include at least one selected from, for example, silica, alumina, titania, zirconia, and ceria. The coating layer 30 is configured to fix the light-emitting nanoparticle 20 to the base particle 10, and thus the convex-concave nanopattern on the surface of the base particle 10 may be maintained, ensuring the structural stability. At the same time, the light extraction efficiency of the nanostructured hybrid particle may be further enhanced, and more particularly, the light extraction efficiency of the nanostructured hybrid particle may be increased to several times the light extraction efficiency of the standard nanoparticle. For example, the light extraction efficiency of the nanostructured hybrid particle including the coating layer 30 may be increased up to about 7 times the light extraction efficiency of the standard nanoparticle.

On a surface of silica, alumina, titania, zirconia, or ceria that consists the coating layer 30, at least one functional group selected from a substituted or unsubstituted $C_6$-$C_{20}$ aryl group, a substituted or unsubstituted $C_1$-$C_{20}$ alkyl group, a substituted or unsubstituted $C_2$-$C_{20}$ alkenyl group, and a substituted or unsubstituted $C_2$-$C_{20}$ alkynyl group may be further included.

Here, at least one hydrogen of the functional groups may be substituted with a halogen atom, a $C_1$-$C_{20}$ alkyl group substituted with a halogen atom (e.g., $CCF_3$, $CHCF_2$, $CH_2F$, or $CCl_3$), a $C_1$-$C_{20}$ alkoxy group, a $C_2$-$C_{20}$ alkoxyalkyl group, a hydroxyl group, a nitro group, a cyano group, an amino group, an amidino group, a hydrazine, a hydrazine, a carboxyl group or a salt thereof, a sulfonyl group, a sulfamoyl group, a sulfonic acid or a salt thereof, a phosphoric acid or a salt thereof, a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_6$-$C_{20}$ arylalkyl group, a $C_6$-$C_{20}$ heteroaryl group, a $C_7$-$C_{20}$ heteroarylalkyl group, a $C_6$-$C_{20}$ heteroaryloxy group, a $C_6$-$C_{20}$ heteroaryloxyalkyl group, or a $C_6$-$C_{20}$ heteroarylalkyl group.

The functional groups and the substituents used in the present specification may be as defined above.

In particular, on a surface of silica, alumina, titania, zirconia, or ceria that consists the coating layer 30, a phenyl-group containing functional group, e.g., phenyl, phenylethyl, and N-propylaniline; a $C_1$-$C_{18}$ linear or branched hydrocarbon, e.g., methyl, ethyl, isobutyl, octyl, octadecyl, vinyl, allyl, and 7-octene-1-yl; or a mixture thereof may be further included.

Figure 1B:
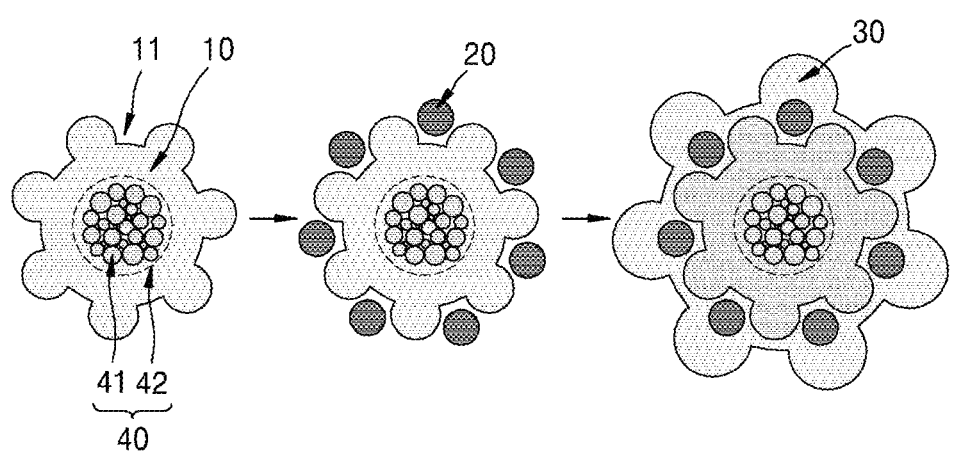

In another exemplary embodiment, as shown in FIG. 1B, the nanostructured hybrid particle may further include a core particle inside of the base particle 10, the core particle including a cluster 41 of superparamagnetic nanoparticles; and a shell 42 surrounding the cluster and including at least one selected from silica, alumina, titania, zirconia, and ceria.

The superparamagnetic nanoparticles that constitute the cluster 41 located in the center of the base particle 10 may include, for example, at least one selected from the group consisting of FeO, $Fe_2O_3$, $Fe_3O_4$, $MnFe_2O_4$, $CoFe_2O_4$, $NiFe_2O_4$, Fe, Co, and Ni. The shell 42 that surrounds the cluster 41 consisting of the superparamagnetic nanoparticles may include, for example, at least one selected from silica, alumina, titania, zirconia, and ceria. When the core particle 40 including the cluster 41 and the shell 42 surrounding the cluster 41 is included inside of the base particle 10, the cluster may be easily collected and condensed upon magnetic properties thereof. Accordingly, the shell 42 surrounding the cluster 41 may serve as a glue between the magnetic cluster 41 and the hydrophobic base particle 10.

The nanostructured hybrid particle may have a diameter from about 10 nm to about 10 μm. For example, the nanostructured hybrid particle have a diameter from about 50 nm to about 9 μm, for example, about 50 nm to about 500 nm. When the diameter of the nanostructured hybrid particle is within the ranges above, an LED chip on which the nanostructured hybrid particle is packaged may exhibit high light extraction efficiency, and the smaller the diameter is, the better light extraction efficiency the nanostructured hybrid particle may exhibit. However, when the diameter of the nanostructured hybrid particle is smaller than 50 nm, the nanopattern may be formed in small number on the surface of the hybrid particle. In addition, due to a large radius of the curvature of the surface of the hybrid particle, the concave portion of the convex-concave nanopattern is opened, and thus there may be difficulties in disposing the nanoparticle therein.

The nanostructured hybrid particle may have a repeated convex-concave nanopattern in a size from about 10 nm to about 50 nm.

The nanostructured hybrid particle may be manufactured as follows.

In an exemplary embodiment, a method of manufacturing the nanostructured hybrid particle includes: obtaining a hydrophobic base particle having a convex-concave nanopattern on a surface thereof by performing a sol-gel process between an alkoxide compound represented by Formula 1 below and an alkoxide compound represented by Formula 2; and arranging a hydrophobic light-emitting nanoparticle in a concave portion of the convex-concave structure of the base particle by mixing and stirring a mixture of a first solution in which the base particle is dispersed and a second solution in which the light-emitting nanoparticle is dispersed:

$$R^1M(OR^2)_m \qquad \text{<Formula 1>}$$

wherein, in Formula 1,

M is silicon (Si), aluminum (Al), titanium (Ti), zirconium (Zr), or cerium (Ce), $R^1$ is a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_3$-$C_{20}$ heteroaryl group, a substituted or unsubstituted $C_4$-$C_{20}$ cycloalkyl group, or a substituted or unsubstituted $C_3$-$C_{20}$ heterocycloalkyl group, $R^2$ is a linear or branched, substituted or unsubstituted $C_1$-$C_5$ alkyl group, and, m is an integer of 2 or greater and m+1 denotes a valence of M $$M(OR^3)_m \qquad \text{<Formula 2>}$$

wherein, in Formula 2,

M is Si, Al, Ti, Zr, or Ce, $R^3$ is a linear or branched, substituted or unsubstituted $C_1$-$C_5$ alkyl group, and m denotes a valence of M.

The alkoxide compound of Formula 2 may control degree of hydrophobicity of the base particle to be obtained. For example, if an addition rate of the alkoxide compound of Formula 1 and the alkoxide compound of Formula 2 is relatively increased, the degree ph hydrophobicity derived from $R^1$ and remained in the base particle is relatively reduced, thereby weakening the hydrophobicity of the base particle.

The alkoxide compound of Formula 1 or a combination of the alkoxide compounds of Formulae 1 and 2 may be used to obtain a spherical, hydrophobic base particle having a convex-concave nanopattern on a surface thereof.

Then, a first solution in which the obtained base particle is dispersed is mixed with a second solution in which a hydrophobic light-emitting nanoparticle is dispersed, and then, the mixed solution was stirred, thereby arranging the light-emitting nanoparticle in a concave portion of the convex-concave structure of the base particle.

The second solution in which the light-emitting nanoparticle is dispersed may include, for example, quantum dots synthesized in a non-polar organic solvent, wherein the quantum dots may have excellent optical characteristics in terms of quantum efficiency and emission intensity. In addition, the quantum dots may have a structure configured by hydrophobic surfactants that protect a surface of the quantum dot for prevention of quantum dot aggregation. That is, a polar portion of the surfactants is combined with a surface of the light-emitting nanoparticle while a non-polar carbon chain is exposed of the surfactant, thereby exhibitng hydrophobicity. In addition, particles push one another due to van der Waals force therebetween, and thus a colloidal solution having excellent dispersibility may be prepared.

Upon mixing and stirring of a mixture of the first solution in which the base particle is dispersed and the second solution in which the hydrophobic light-emitting nanoparticle is dispersed, the light-emitting nanoparticle may be self-assembled in a concave portion of the convex-concave nanopattern on the surface of base particle.

In an exemplary embodiment, the method of manufacturing the nanostructured hybrid particle may further include forming a coating layer to cover the light-emitting nanoparticle.

The coating layer may be formed by using a precursor having a smaller refractive index than that of the light-emitting nanoparticle and a greater refractive index than that of air. In an exemplary embodiment, the precursor for forming the coating layer may use a homogeneous or heterogeneous alkoxide compound including a same metal atom included in at least one of the alkoxide compounds of Formulae 1 and 2, thereby manufacturing the nanostructured hybrid particle including the coating layer.

In an exemplary embodiment, the method of manufacturing the nanostructured hybrid particle may further include bonding a functional group to the coating layer, the functional group being selected from a substituted or unsubstituted C6-C20 aryl group, a substituted or unsubstituted C1-C20 alkyl group, a substituted or unsubstituted C2-C20 alkenyl group, and a substituted or unsubstituted C2-C20 alkynyl group. Examples of the functional group include a phenyl-group containing functional group, e.g., phenyl, phenylethyl, and N-propylaniline; a $C_1$-$C_{18}$ linear or branched hydrocarbon, e.g., methyl, ethyl, isobutyl, octyl, octadecyl, vinyl, allyl, and 7-octene-1-yl; or a mixture thereof.

The bonding of the functional group to the coating layer may be performed by sol-gel process using an alkoxide compound represented by Formula 3 below:

$$R^4M(OR^5)_m \qquad \text{<Formula 3>}$$

wherein, in Formula 3,

M, as the metal atom used to form the coating layer, is Si, Al, Ti, Zr, or Ce, $R^4$ is a substituted or unsubstituted C6-C20 aryl group, a substituted or unsubstituted C1-C20 alkyl group, a substituted or unsubstituted C2-C20 alkenyl group, or a substituted or unsubstituted C2-C20 alkynyl group, $R^5$ is a linear or branched substituted or unsubstituted C1-C5 alkyl group, and, m an integer of at least 2, wherein m+1 denotes a valence of M.

The alkoxide compound of Formula 3 undergone the sol-gel process may be used to form a coating layer to which a $R^4$ functional group is combined. Here, M in Formula 3 may be a same metal atom with the metal atom used in the formation of the coating layer.

In the nanostructured hybrid particle manufactured as described above, light extraction may occur in all three-dimensional directions. Thus, the nanostructured hybrid particle may exhibit further increased light extraction efficiency, compared to a case of a two-dimensional semiconductor having a nanopattern on a surface thereof that allows light extraction in only one direction. In addition, due to the nanopattern on the surface, there is a limit in a contact area among neighboring particles in accordance with a weight of the particles, so as to prevent occurrence of cohesion among the neighboring particles.

According to another aspect of the present inventive concept, there is provided a light-emitting diode including the nanostructured hybrid particle.

When a white LED is manufactured using the nanostructured hybrid particle having increased light extraction efficiency, color rendering index (CRI) and the light extraction efficiency of a white LED may be also improved. In addition, when a white LED is manufactured using at least two nanostructured hybrid particles having adjacent light-emitting wavelength, CRI and the light extraction efficiency of a white LED may be also improved.

Moreover, the nanostructured hybrid particle that exhibits high light extraction efficiency may be applied to a hypersensitive bio-imaging reagent or a biosensor. For example, the nanostructured hybrid particle may be applied to a bioassay kit, a bio-imaging reagent, or the like.

Hereinafter, one or more exemplary embodiments will be described in more detail with reference to the following Examples. However, these Examples are for illustrative purposes only and are not intended to limit the scope of the one or more embodiments.

EXAMPLES

Hydrophobic quantum dot (QD) nanoparticles used in the following Examples were purchased from Nanosquare Company, and 4 types of the hydrophobic QD nanoparticles each having an emission wavelength of 620 nm (hereinafter, referred to as QD1, Red 1), 611 nm (referred to as QD2, Red 2), 530 nm (referred to as QD3, Green), and 490 nm (referred to as QD4, Blue) were used. A blue LED chip used in a package to emit white light was 5050 package available from Taein Semiconductor Company.

<Preparation of Nanostructured Hybrid Particle>

Example 1

(1) Preparation of Hydrophobic Silica Particles (npS) Having Nanopatterns on a Surface Thereof 9 mL of distilled water and 6 mL of NH$_4$OH were added to 400 mL of ethanol and stirred for 30 minutes, and 5.3 mL of tetraethoxysilane and 2.3 mL of octadecyltrimethoxysilane were added to the mixed solution at the same time, and then, stirred for a day (Day 1). 9 mL of distilled water and 6 mL of NH$_4$OH were added thereto and stirred for 30 minutes, and 5.3 mL of tetraethoxysilane and 2.3 mL of octadecyltrimethoxysilane were added to the mixed solution at the same time, and then, stirred for a day (Day 2). At this point, a small amount of a sample was taken from the mixed solution, and hydrophobic silica (npS) (where np denotes nanopatterns, S denotes silica, and superscript ° denotes a hydrophobic property, throughout the Examples below) particles formed therein were observed using a transmission electron microscope (TEM) as shown in a section (a) of FIG.

2. Here, a value of mean diameter±standard deviation calculated using 100 particles was 86±8 nm.

Next, 400 mL of ethanol, 9 mL of distilled water, and 6 mL of NH$_4$OH were added to the mixed solution above and stirred for 30 minutes, and 5.3 mL of tetraethoxysilane and 2.3 mL of octadecyltrimethoxysilane were added to the mixed solution at the same time, and then, stirred for a day (Day 3). 9 mL of distilled water and 6 mL of NH$_4$OH were added thereto and stirred for 30 minutes, and 5.3 mL of tetraethoxysilane and 2.3 mL of octadecyltrimethoxysilane were added to the mixed solution at the same time, and then, stirred for a day (Day 4). 200 mL of ethanol, 9 mL of distilled water, and 6 mL of NH$_4$OH were added to the mixed solution above and stirred for 30 minutes, and 5.3 mL of tetraethoxysilane and 2.3 mL of octadecyltrimethoxysilane were added to the mixed solution at the same time, and then, stirred for a day (Day 5).

Figure 2:
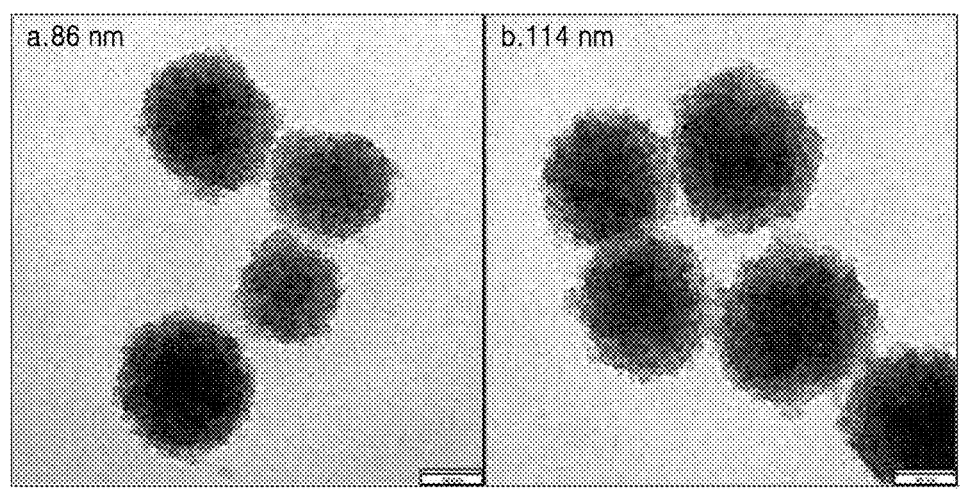
FIG. 2 is a transmission electron microscope (TEM) image of (a) silica particles (i.e., npS particles) synthesized on the second day of the experiment in Example 1 and (b) silica particles (i.e., npS particles) synthesized on the fifth day of the experiment in Example 1.

The mixed solution was subjected to centrifugation, so as to obtain solids, i.e., npS particles. A step of washing of the npS particles was performed twice, each time with 40 mL of ethanol and a mixed solution of 25 mL of ethanol and 15 mL of chloroform. The centrifuged and cleaned npS particles were dispersed in 40 mL of chloroform (0.051 g/mL), to be used in small portions as needed. At this point, the npS particles formed therein were observed using a TEM as shown in a section (b) of FIG. 2. Here, a value of mean diameter±standard deviation calculated using 100 particles was 114±11 nm.

Referring to Table 2, it was confirmed that nanopatterns were clearly shown on surfaces of all the hydrophobic silica particles and that a diameter of the npS particles on Day 5 (114 nm) was greater than that of the npS particles on Day 2 (86 nm) through additional repetitive growth reactions.

(2) Preparation of Nanostructured Hybrid Particles (npSQ$_1$S, Wherein Q$_1$ Denotes QD1)

1 ml of the npS particles (114 nm) that were synthesized in Example 1(1) was diluted with 10 mL of chloroform. In a separate container, 1.3 mL of a hydrophobic QD1 solution (2.0×10$^{-5}$ M) that is commercially available was diluted with 10 mL of chloroform. The diluted QD1 solution was slowly added to a solution containing the npS particles, and then, smoothly stirred for a day, to allow QD1 nanoparticles to fill concave portions of the surface of the npS particles. Then, 20 mL of ethanol was added thereto, and the mixed solution was subjected to centrifugation, so as to obtain solids, i.e., npSQ$_1$ particles. The centrifuged npSQ$_1$ particles were dispersed in 200 mL of ethanol, and 6 mL of distilled water and 4 mL of NH$_4$OH 4 mL were added thereto, and stirred for 10 minutes. Then, 1 mL of tetraethoxysilane was added thereto, and stirred for 3 hours, thereby preparing a silica coating layer on npSQ$_1$S particles to cover a surface thereof. A solution containing the npSQ$_1$S particles was subjected to centrifugation, so as to obtain solids, i.e., npSQ$_1$S particles. The centrifuged and cleaned npSQ$_1$S particles were washed twice with 40 mL of ethanol, and then, eventually dispersed in 20 mL of ethanol.

(3) Preparation of Nanostructured Hybrid Particle (npSQ$_1$S$^{Ph}$, wherein Q$_1$ Denotes QD1 and S$^{Ph}$ Denotes Silica Containing a Phenylethyl Group)

To synthesize npSQ$_1$S$^{Ph}$ particles, the centrifuged npSQ$_1$ particles were in a mixed solvent of 134 mL of ethanol and 66 mL of chloroform. Here, 6 mL of distilled water and 4 mL of NH$_4$OH were added thereto, and then, stirred for 10 minutes. Then, 0.7 mL of tetraethoxysilane and 0.3 mL of phenylethyltrimethoxysilane were added thereto, and stirred for 6 hours, thereby preparing npSQ$_1$S$^{Ph}$ particles on which a silica coating layer including a phenylethyl functional group was formed. A solution containing the prepared npSQ$_1$S$^{Ph}$ particles was subjected to centrifugation, so as to obtain solids, i.e., npSQ$_1$S$^{Ph}$ particles. A step of washing of the npSQ$_1$S$^{Ph}$ particles was performed twice, each with 40 mL of ethanol and a mixed solution of 25 mL of ethanol and 15 mL of chloroform. The centrifuged and cleaned npSQ$_1$S$^{Ph}$ particles were eventually dispersed in 20 mL of chloroform.

Figure 3A:
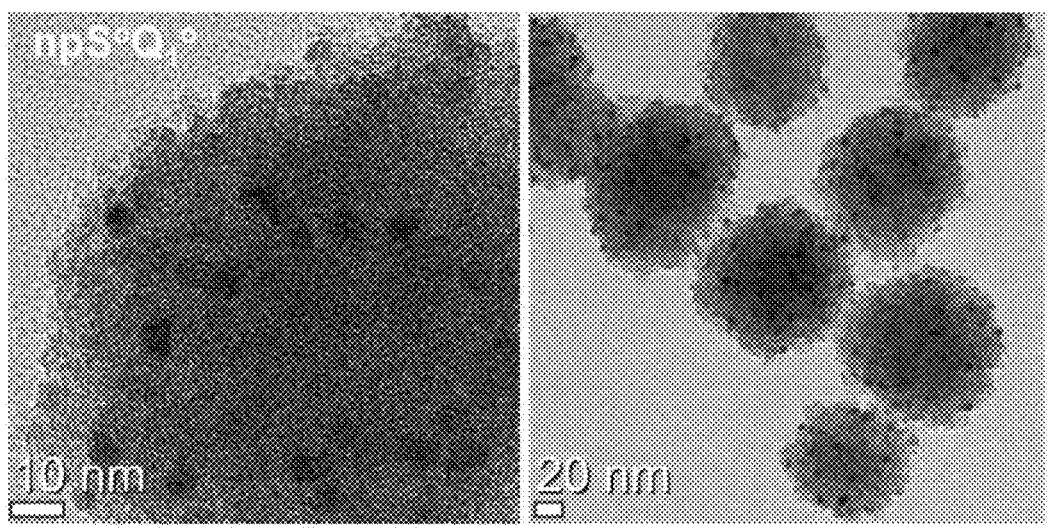
FIGS. 3A to 3C are each a TEM image of $npSQ_1$ particles on which QD1 nanoparticles prepared in Example 1 are self-assembled, a TEM image of $npSQ_1S$ particles that are coated with silica, and a TEM image of $npSQ_1S^{Ph}$ particles on which a silica coating layer including a phenylethyl group is formed.
Figure 3B:
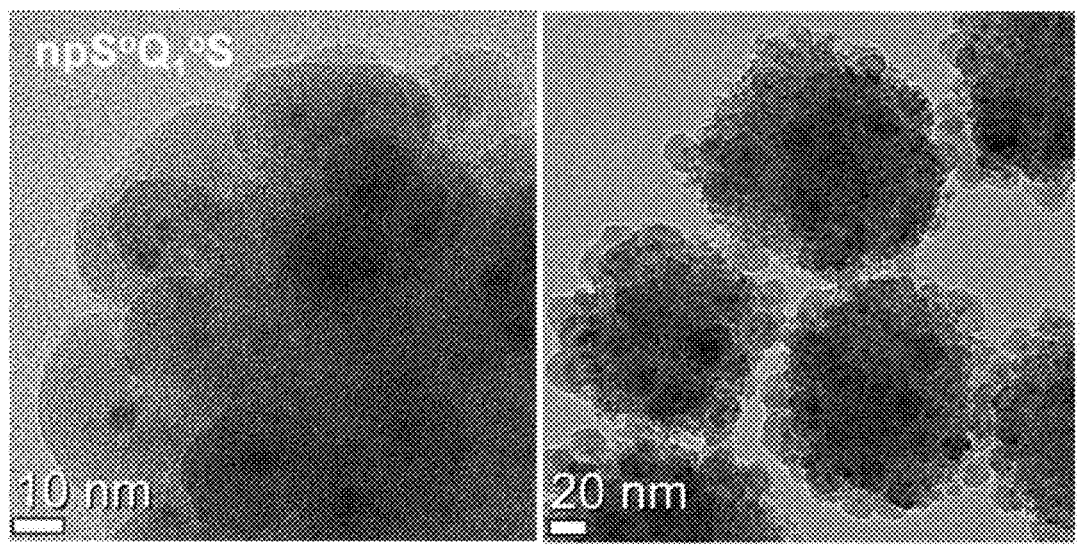
Figure 3C:
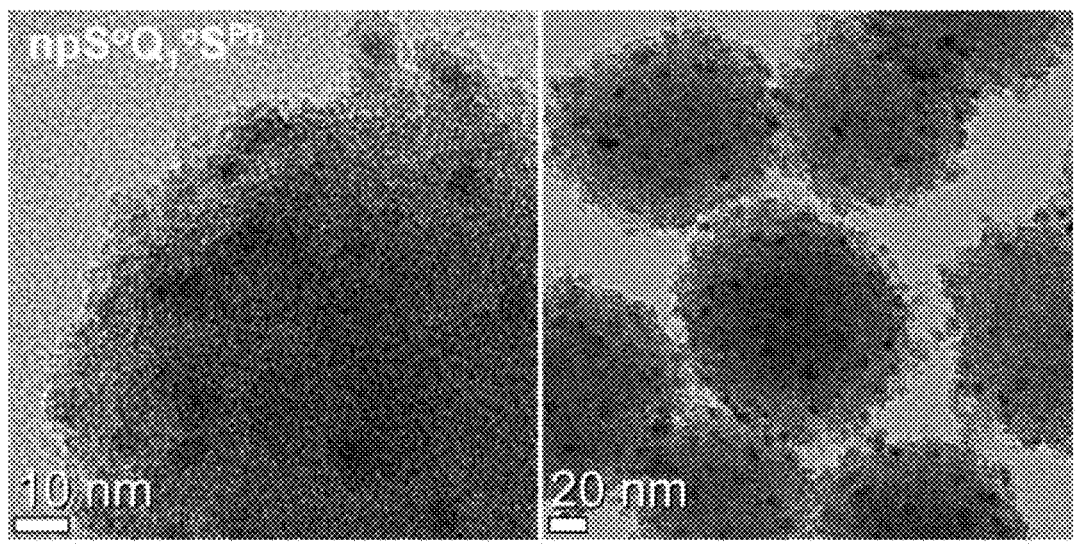

The synthetic npSQ$_1$, npSQ$_1$S, and npSQ$_1$S$^{Ph}$ particles were each observed using a TEM as shown in FIGS. 3A to 3C. Referring to FIGS. 3A to 3C, it was confirmed that the QD1 nanoparticles filled the concave portions of the surface of the hydrophobic silica particles and that the surface of the npSQ$_1$° particles was coated with silica or a silica containing a phenylethyl group.

Example 2

Nanostructured hybrid hydrophobic particles, i.e., npSQ$_2$S and npSQ$_2$SP$^h$ particles (where Q$_2$ denotes QD2), were prepared in the same manner as in Example 1, except that a hydrophobic QD2 solution was used instead of the QD1 solution.

Example 3

Nanostructured hybrid hydrophobic particles, i.e., npSQ$_3$S and npSQ$_3$S$^{Ph}$ particles (where Q$_3$ denotes QD3), were prepared in the same manner as in Example 1, except that a hydrophobic QD3 solution was used instead of the QD1 solution.

Figure 3D:
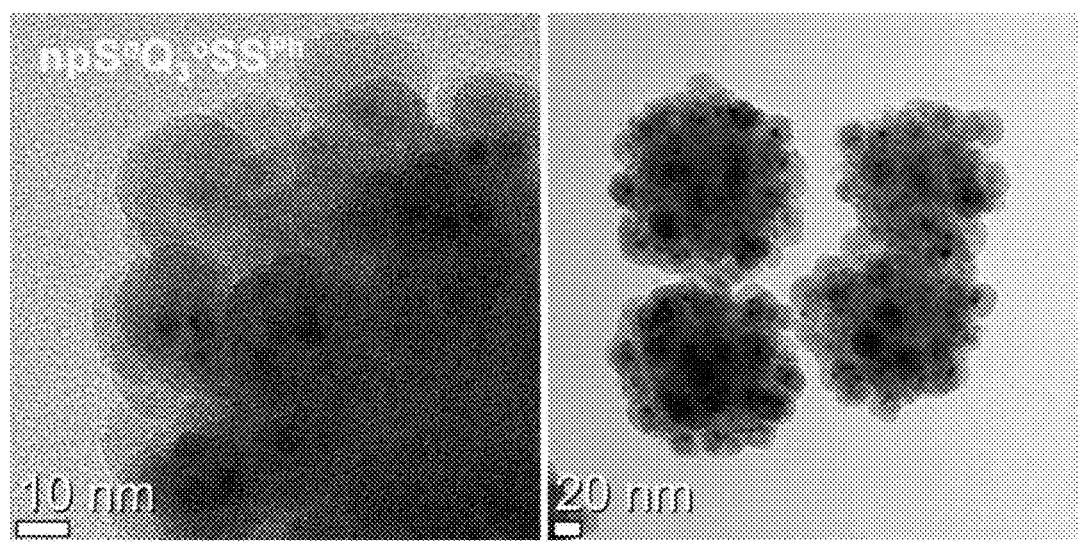
FIG. 3D is a TEM image of $npSQ_1SS^{Ph}$ particles on which QD3 nanoparticles prepared in Example 3 are self-assembled, that are coated with silica, and on which a silica coating layer including a phenylethyl group is formed.
Figure 4:
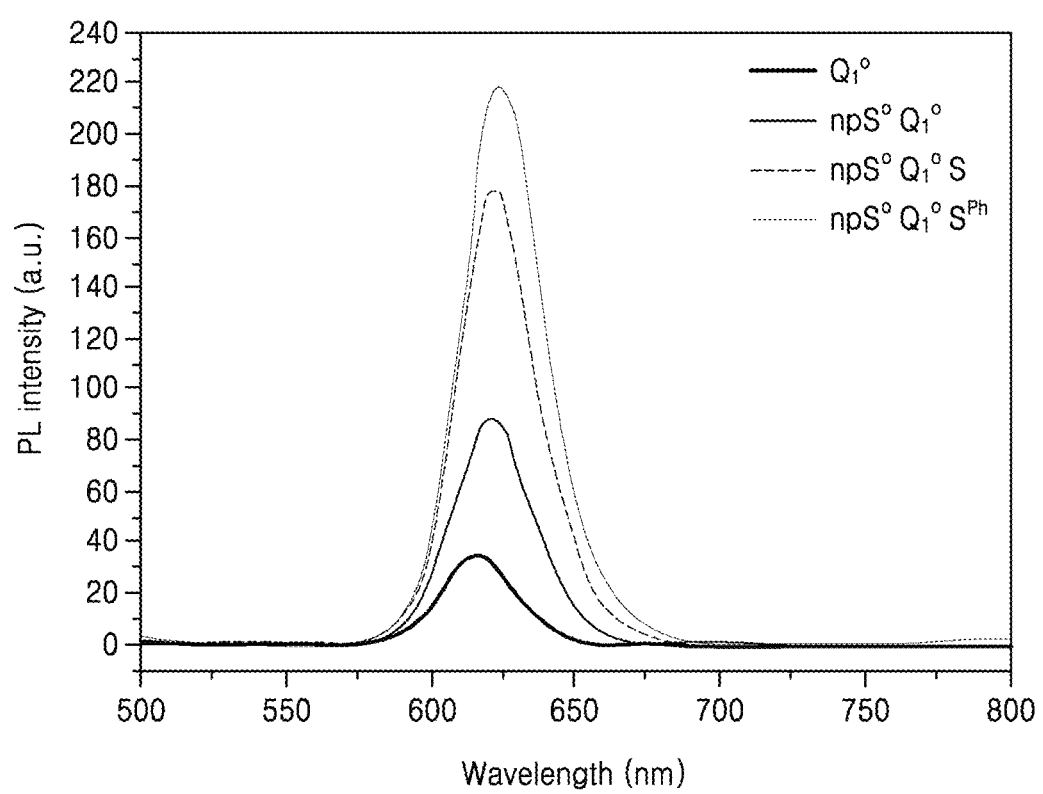
FIG. 4 is a graph showing electroluminescence spectrum of $npSQ_1$ particles, $npSQ_1S$ particles, and $npSQ_1S^{Ph}$ particles (where $Q_1$=QD1) that are prepared in Example 1.
Figure 5:
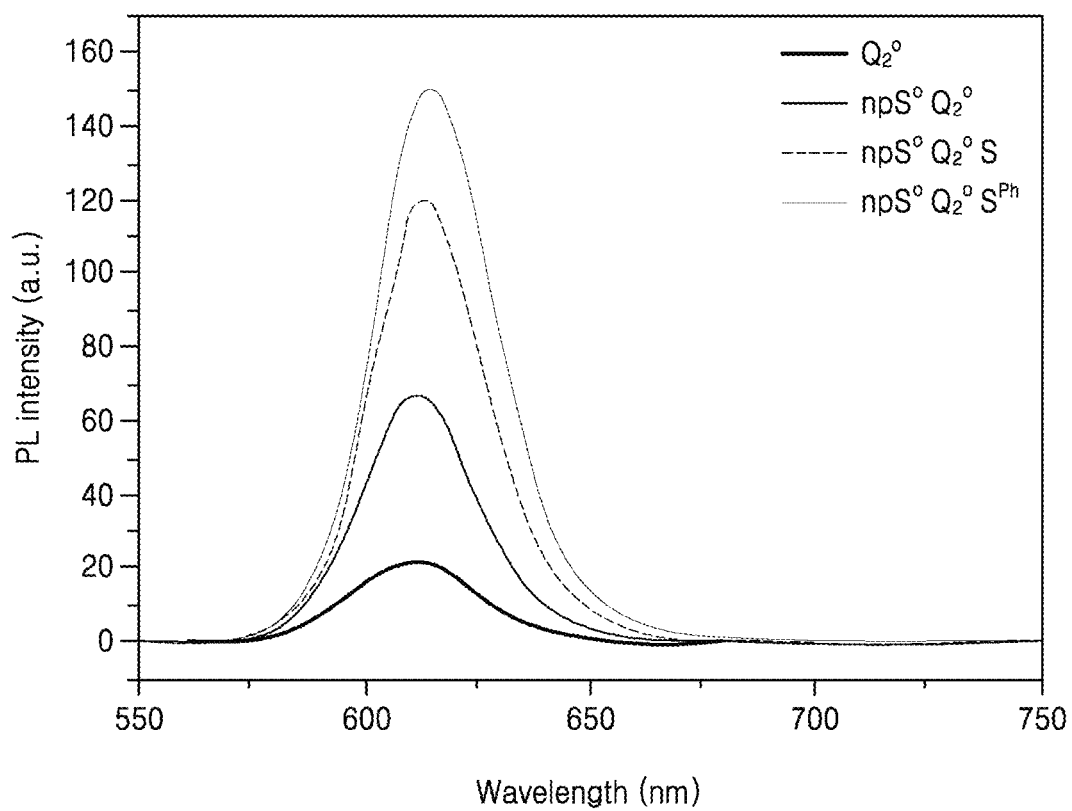
FIG. 5 is a graph showing electroluminescence spectrum of $npSQ_2^o$ particles, $npSQ_2S$ particles, and $npSQ_2S^{Ph}$ particles (where $Q_2$=QD2) that are prepared in Example 2.
Figure 6A:
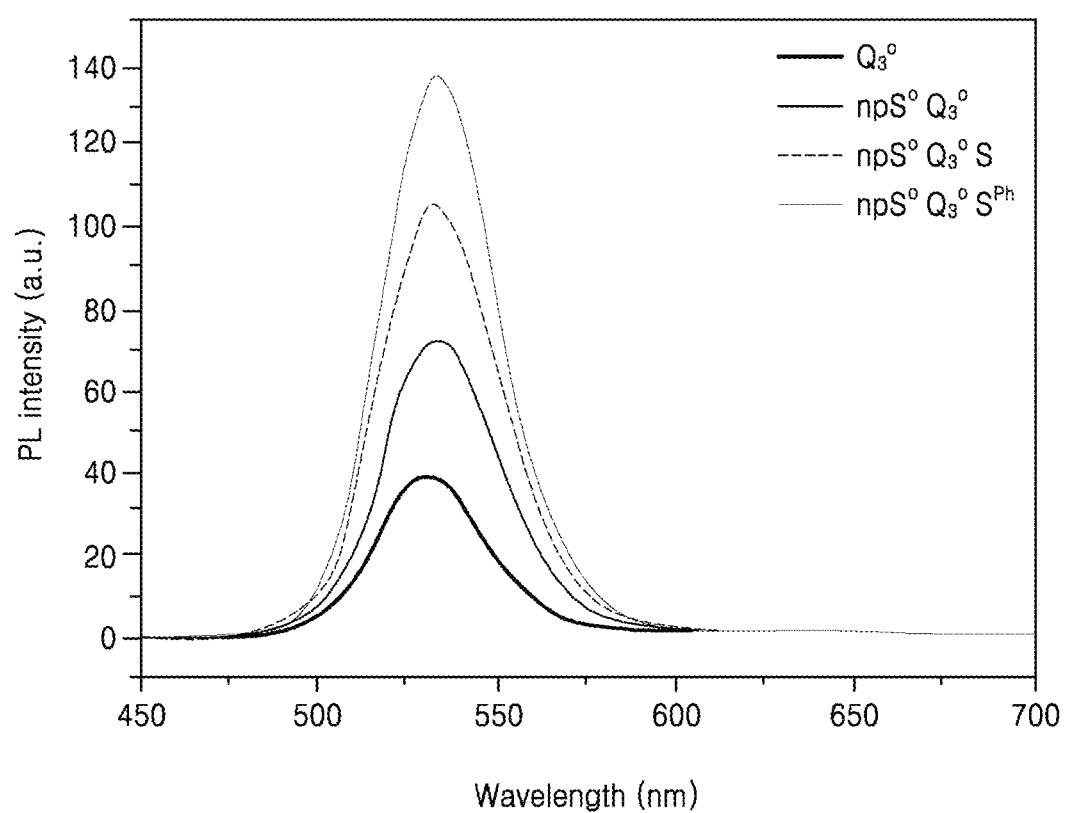
FIGS. 6A and 6B are each a graph showing electroluminescence spectrum of $npSQ_3$ particles, $npSQ_3S$ particles, and $npSQ_3S^{Ph}$ particles (where $Q_3$=QD3) that are prepared in Example 3, and a graph showing electroluminescence spectrum of $npSQ_3$ particles, $npSQ_3S$ particles, and $npSQ_3SS^{Ph}$ particles (where $Q_3$=QD3) that are prepared in Example 3.
Figure 6B:
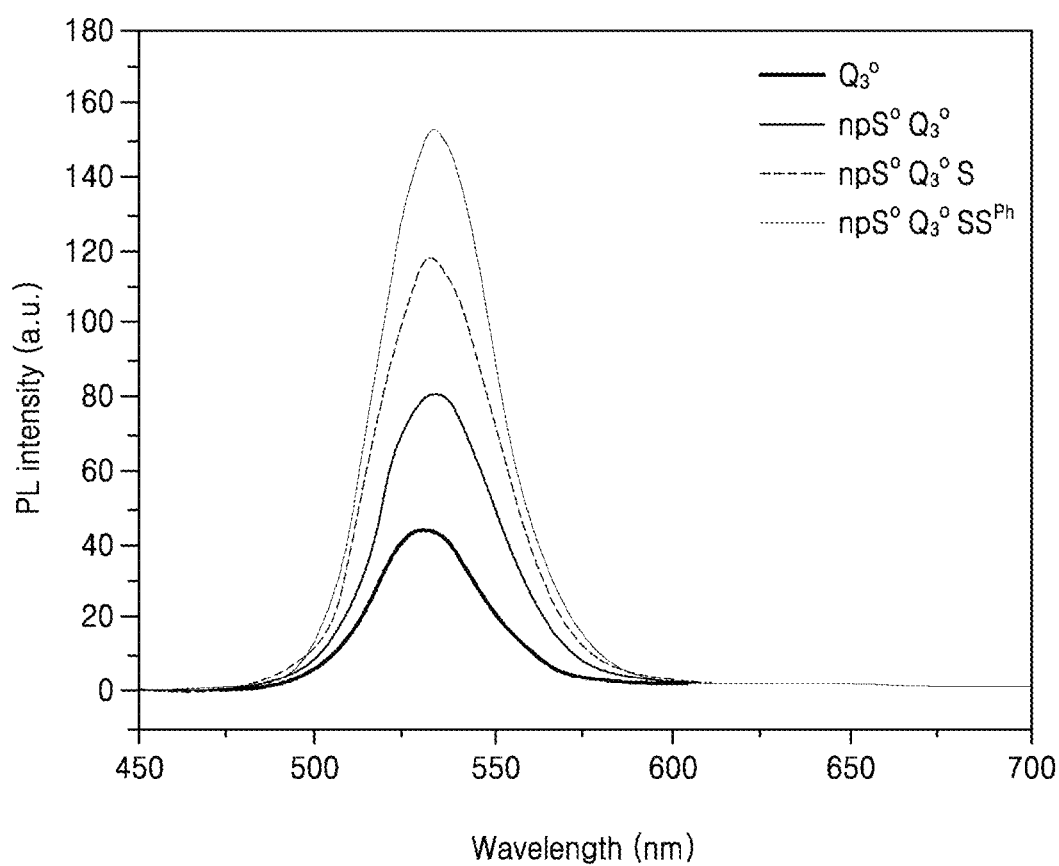
Figure 7:
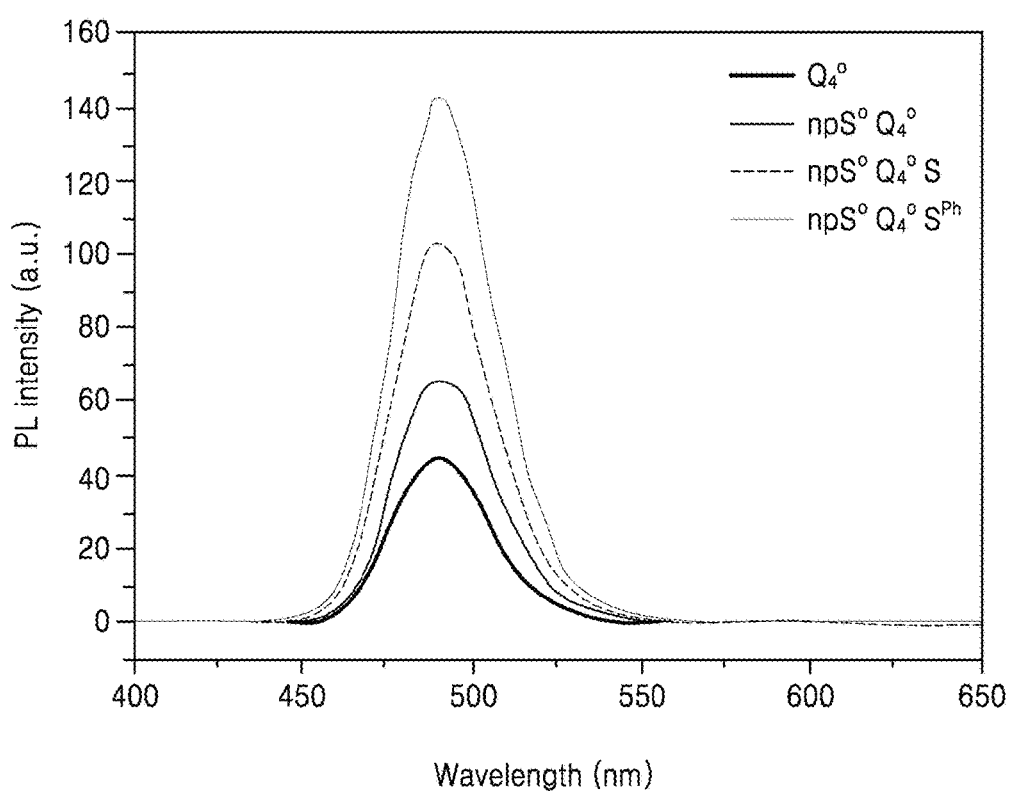
FIG. 7 is a graph showing electroluminescence spectrum of $npSQ_4$ particles, $npSQ_4S$ particles, and $npSQ_4S^{Ph}$ particles (where $Q_4$=QD4) that are prepared in Example 4.

In addition, 66 mL of ethanol and 133 mL of chloroform were added to about 200 mL of a solution that was used at last in the synthesis of the nanostructured hybrid hydrophobic particles, i.e., npSQ$_3$S particles, in Example 3, the solution being used to prepare the npSQ$_3$S particles including a silica coating layer to cover the surface of the npSQ$_3$ particles. Then, 0.28 mL of phenylethyltrimethoxysilane was added thereto, and stirred for 15 hours, thereby preparing npSQ$_3$SS$^{Ph}$ particles on which a silica coating layer including a phenylethyl functional group was formed. A solution containing the prepared npSQ$_3$SS$^{Ph}$ particles was subjected to centrifugation, so as to obtain solids, i.e., npSQ$_3$SS$^{Ph}$ particles. A step of washing of the npSQ$_3$SS$^{Ph}$ particles was performed twice, each with 40 mL of ethanol and a mixed solution of 15 mL of ethanol and 10 mL of chloroform. The centrifuged and cleaned npSQ$_3$SS$^{Ph}$ particles were eventually dispersed in 20 mL of chloroform. Accordingly, referring to FIGS. 3D and 6B, it was confirmed that, the nanopatterns on the surface of the coating layer, which was prepared through two steps when bonding the phenyl group to the surface of the particles, are maintained better than those on the surface of the coating layer, which was prepared in a single step when bonding the phenyl group to the surface of the particles, thereby increasing fluorescence.

Example 4

Nanostructured hybrid hydrophobic particles, i.e., npSQ$_4$S and npSQ$_4$S$^{Ph}$ particles (where Q$_4$ denotes QD4), were prepared in the same manner as in Example 1, except that a hydrophobic QD3 solution was used instead of the hydrophobic QD1 solution.

The electroluminescence spectrum of each of the npSQ$_N$, npSQ$_N$S and npSQ$_N$S$^{Ph}$ particles (where N denotes 1 for QD1, 2 for QD2, 3 for QD3, 4 for QD4) of Examples 1 to 4 was measured by using the 7000 Fluorescence Spectrophotometer (available from HITACHI Company), and the results are shown in FIGS. 4 to 7.

For the measurement in all the light-emission spectra, the concentration of the QD nanoparticle filtrates obtained by performing centrifugation of the $npSQ_N^o$ particles were measured in a sample solution of which the concentration of the QD solutions was fixed. Here, the concentration of the QD particles was adjusted on the assumption that all the QD particles, except the QD nanoparticle filtrates, among the QD particles used in the reaction were integrated with the hybrid structure of the $npSQ_N^o$ particles. Therefore, in consideration of a substantial loss in the QD particles during the synthesis, it was deemed that the concentration of the QD particles was reduced even by a minimum amount as the synthesis proceeded to the next step. However, referring to FIGS. 4 to 7, it was confirmed that the light-emission intensity was significantly increased as the synthesis proceeded to the next step. In all the exemplary embodiments provided herein, the light extraction efficiency of the silica particles was increased by hundreds of times (%) compared to the standard light extraction efficiency of light-emitting nanoparticles.

<Manufacture of a White LED>

White LEDs were each prepared in following Examples 5 to 9 by using the $npSQ_1S$ and $npSQ_1S^{Ph}$ particles of Example 1 and the $npSQ_2S$ and $npSQ_2S^{Ph}$ particles of Example 2.

When white LEDs were manufactured by using a blue LED chip and a fluorophore, the white LEDs may have different light characteristics according to a type of the blue LED chip although the same fluorophore was used throughout the manufacture. Thus, to establish criteria for comparison, a white LED was prepared in Comparative Example 1.

In addition, due to an inevitably contradictory relationship between color rendering index (CRI) and luminous efficacy, a red fluorephore may be additionally used to supplement red light. In this regard, the CRI of the white LED equipped with the red fluorephore increases while the luminous efficacy of the white LED equipped with the red fluorephore decreases. Thus, to establish criteria for comparison in consideration of such a phenomenon, a white LED was prepared in Comparative Example 2.

Comparative Example 1

Preparation of White LED with YAG Fluorophore

OE-6630 A and OE-6630 B, which are silicone resins available from DOW CORNING Company, were mixed at a weight ratio of 1:4, and then, were impregnated under vacuum for 1 hour to remove gas therefrom. The mixture of the silicone resins and YAG fluorophore (i.e., $Y_3Al_5O_{12}$:$Ce^{3+}$; NYAG4156 available from Intematix Company) were mixed at a weight ratio of 100:10, and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Comparative Example 1 were measured, and the results are shown in Table 1 below. In addition, the electroluminescence spectrum obtained by applying electric current to the white LED of Comparative Example 1 is shown in FIG. 8.

Figure 8:
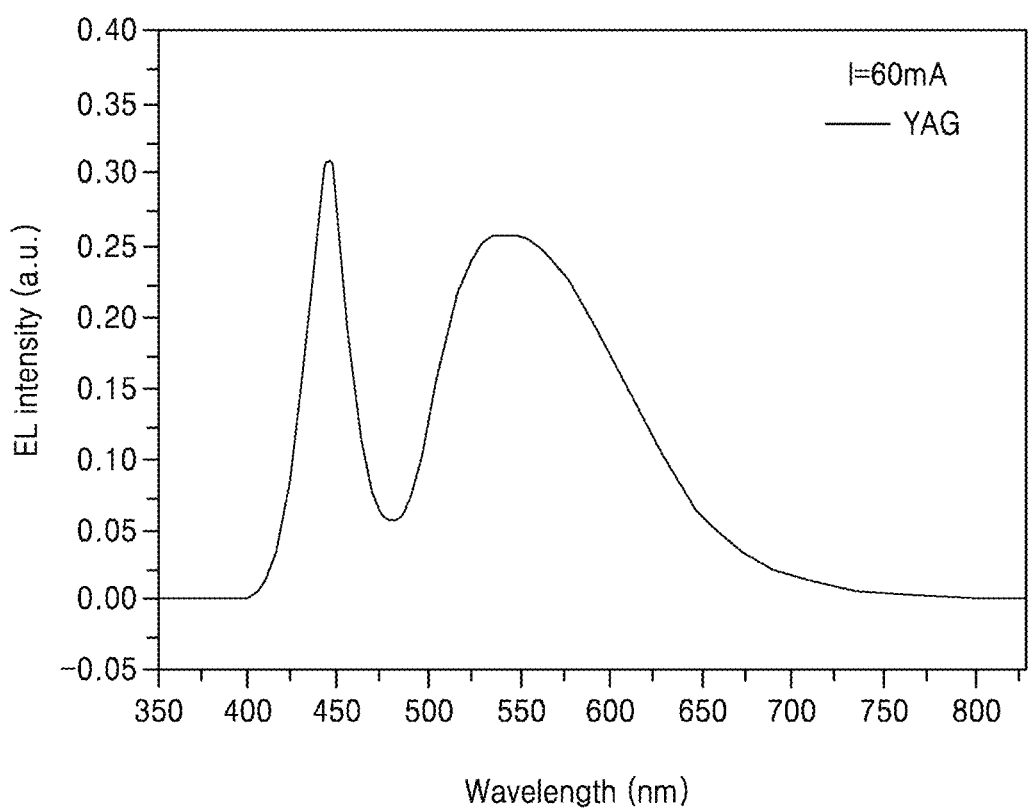
FIG. 8 is a graph showing electroluminescence spectrum obtained by applying electric current to a white light-emitting diode (LED) that is prepared in Comparative Example 1.

Referring to Table 1, it was confirmed that the white LED of Comparative Example 1, which was prepared by using YAG fluorophore only, has good luminous efficacy of 63 lm/W, however, as shown in FIG. 8, the white LED of Comparative Example 1 shows insufficient red light based on the CRI of 66.

Comparative Example 2

Preparation of White LED with Quantum Dots and YAG Fluorophore 3 mL of each of the QD1 and QD2 solutions that are commercially available were subjected to centrifugation, and solids obtained by removing the filtrates were vacuum-dried. Meanwhile, OE-6630 A and OE-6630 B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the QD1 solution, and the QD2 solution were mixed at a weight ratio of 100:10:0.006:0.003. The resulting mixture was placed on a blue LED chip, and the blue LED chip was subjected to curing at a temperature of 60° C. for 1 hour and at a temperature of 150° C. for 1 hour, thereby manufacturing a white LED.

Figure 9:
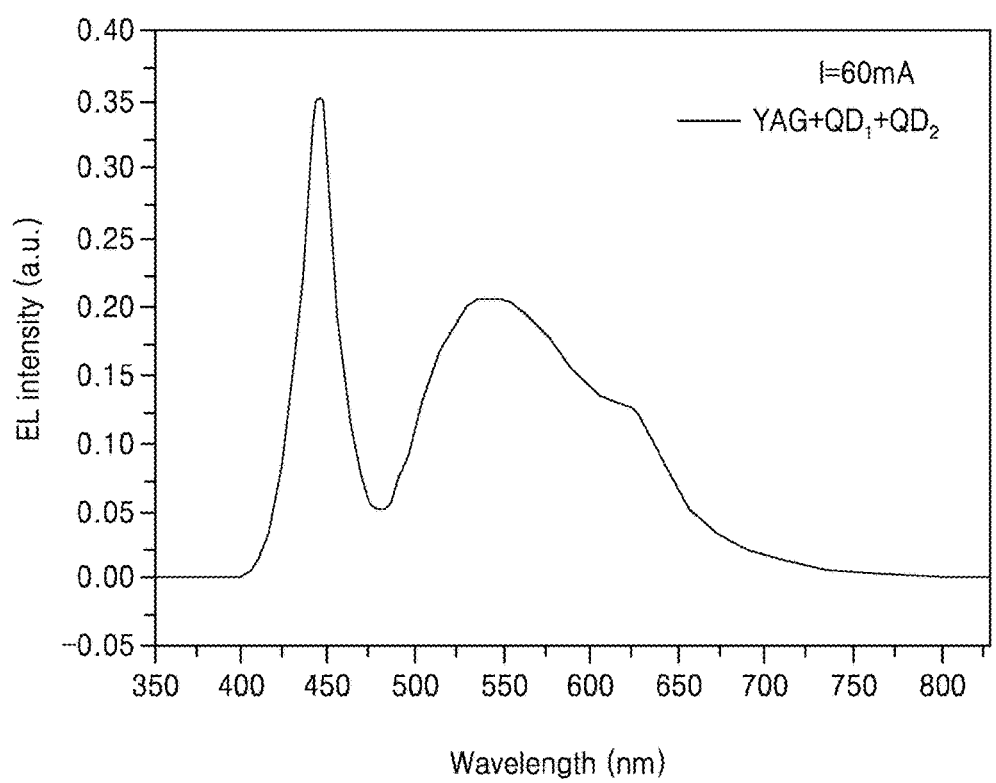
FIG. 9 is a graph showing electroluminescence spectrum obtained by applying electric current to a white LED that is prepared in Comparative Example 2.

The CRI, color temperature, and luminous efficacy of the white LED of Comparative Example 2 were measured by using the LED total luminous flux measurement system (LEOS OPI-100), and the results are shown in Table 1 above. In addition, the electroluminescence spectrum obtained by applying electric current to the white LED of Comparative Example 2 is shown in FIG. 9.

Referring to Table 1, it was confirmed that, compared to the white LED of Comparative Example 1 prepared by using YAG fluorophore only, the white LED of Comparative Example 2, which was prepared by using YAG fluorophore and the QD solutions together, has good CRI that is slightly improved from 66 to 75, but poor luminous efficacy that is significantly reduced from 63 lm/W to 38 lm/W. Referring to the electroluminescence spectrum shown in FIG. 9, when a red QD was additionally used to supplement red light, the luminous efficacy of the white LED of Comparative Example significantly decreased.

Example 5

Preparation of White LED with Nanostructured Hybrid Particle and YAG Fluorophore 3 mL of each of the solution containing the $npSQ_1S$ particles of Example 1 and the solution containing the $npSQ_2S$ particles of Example 2 were subjected to centrifugation, and solids obtained by removing the filtrates were vacuum-dried. Meanwhile, OE-6630 A and OE-6630 B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the $npSQ_1S$ particles, and the $npSQ_2S$ particles were mixed at a weight ratio of 100:10:0.50:0.25 (i.e., 0.3935 g:0.0392 g:0.0021 g:0.0010 g), and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Example 5 were measured, and the results are shown in Table 1 below. Referring to Table 1, it was confirmed that, compared to the standard white LED of Comparative Example 2, the white LED of Example 5 has excellent CRI and luminous efficacy. It was also confirmed that, compared to the white LED of Comparative Example 1, the white LED of Example 5 has good CRI, but reduced luminous efficacy.

Example 6

Preparation of White LED with Nanostructured Hybrid Particle and YAG Fluorophore 3 mL of each of the solution containing the $npSQ_1S^{Ph}$ particles of Example 1 and the solution containing the $npSQ_2S^{Ph}$ particles of Example 2 were subjected to centrifugation, and solids obtained by removing the filtrates were vacuum-dried. Meanwhile, OE-6630 A and OE-6630 B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the $npSQ_1S^{Ph}$ particles, and the $npSQ_2S^{Ph}$ particles were mixed at a weight ratio of 100:10:0.50:0.25 (i.e., 0.3876 g:0.0378 g:0.0021 g:0.0009 g), and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Example 6 were measured, and the results are shown in Table 1 below. Referring to Table 1, it was confirmed that, compared to the standard white LED of Comparative Example 2, the white LED of Example 6 had excellent CRI and luminous efficacy. It was also confirmed that, compared to the white LED of Comparative Example 1, the white LED of Example 6 has good CRI, but reduced luminous efficacy.

It was also confirmed that, compared to the white LED of Comparative Example 5 coated with silica that does not have a functional group, the white LED of Example 6 coated with silica containing a phenylethyl group had excellent CRI and luminous efficacy.

For reference, the LEDs may be practically used at a color temperature in a range from 4,500 K to 6,000 K. However, the white LEDs of Examples 5 and 6 have a relatively low color temperature when a current is applied thereto. Thus, white LEDs, in which an amount of red nanostructured hybrid particles is reduced, were prepared in Examples 7 and 8 below.

Example 7

Preparation of White LED with Nanostructured Hybrid Particle and YAG Fluorophore 3 mL of each of the solution containing the $npSQ_1S$ particles of Example 1 and the solution containing the $npSQ_2S$ particles of Example 2 were subjected to centrifugation, and solids obtained by removing the filtrates were vacuum-dried. Meanwhile, OE-6630 A and OE-6630 B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the $npSQ_1S$ particles, and the $npSQ_2S$ particles were mixed at a weight ratio of 100:10:0.50:0.25 (i.e., 0.4658 g:0.0459 g:0.0023 g:0.0010 g), and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Example 7 were measured, and the results are shown in Table 1 below. Referring to Table 1, it was confirmed that, compared to the standard white LED of Comparative Example 2, the white LED of Example 7 had excellent CRI and luminous efficacy. It was also confirmed that, compared to the white LED of Comparative Example 1, the white LED of Example 6 has good CRI, but reduced luminous efficacy.

In addition, compared to the white LED of Example 5, the white LED of Example 7 reduced the amount of red nanostructured hybrid particles, so as to relatively alleviate a red part and to increase a color temperature.

Example 8

Preparation of White LED with Nanostructured Hybrid Particle and YAG Fluorophore 3 mL of each of the solution containing the $npSQ_1S^{Ph}$ particles of Example 1 and the solution containing the $npSQ_2S^{Ph}$ particles of Example 2 were subjected to centrifugation, and solids obtained by removing the filtrates were vacuum-dried. Meanwhile, OE-6630 A and OE-6630 B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the $npSQ_1S^{Ph}$ particles, and the $npSQ_2°S^{Ph}$ particles were mixed at a weight ratio of 100:10:0.47:0.23 (i.e., 0.4762 g:0.0484 g:0.0023 g:0.0010 g), and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Example 8 were measured, and the results are shown in Table 1 below. Referring to Table 1, it was confirmed that, compared to the standard white LED of Comparative Example 2, the white LED of Example 8 had excellent CRI and luminous efficacy. It was also confirmed that, compared to the white LED of Comparative Example 1, the white LED of Example 8 has good CRI, but reduced luminous efficacy.

It was also confirmed that, compared to the white LED of Comparative Example 7 coated with silica that does not have a functional group, the white LED of Example 8 coated with silica containing a phenylethyl group had excellent CRI and luminous efficacy.

Example 9

Preparation of White LED with Nanostructured Hybrid Particle and YAG Fluorophore Since the intensity of yellow light emitted from the white LEDs of Examples 5 to 8 is relatively weak in the electroluminescence spectrum, a ratio to which YAG fluorophore was added was slightly increased to optimize the intensity of white light, thereby preparing a white LED as follows.

That is, 3 mL of each of the solution containing the $npSQ_1S^{Ph}$ particles of Example 1 and the solution containing the $npSQ_2S^{Ph}$ particles of Example 2 were subjected to centrifugation, and solids obtained by removing the filtrates were vacuum-dried. Meanwhile, OE-6630 A and OE-6630

B, which are silicone resins available from DOW CORNING Company, were mixed at a weight ratio of 1:4, and then, were impregnated under vacuum for 1 hour to remove gas therefrom. Then, the mixture of the silicone resins, YAG fluorophore, the $npSQ_1S^{Ph}$ particles, and the $npSQ_2°S^{Ph}$ particles were mixed at a weight ratio of 100:11:0.47:0.23 (i.e., 0.5105 g:0.0560 g:0.0024 g:0.0012 g), and then, placed on a blue LED chip. The blue LED chip was subjected to curing at a temperature of 60° C. for 1 hour and at a temperature of 150° C. for 1 hour, thereby manufacturing a white LED.

The CRI, color temperature, and luminous efficacy of the white LED of Example 9 were measured, and the results are shown in Table 1 below. In addition, the electroluminescence spectrum and the color coordinates obtained by applying electric current to the white LED of Example 9 are each shown in FIGS. 10 and 11.

Figure 10:
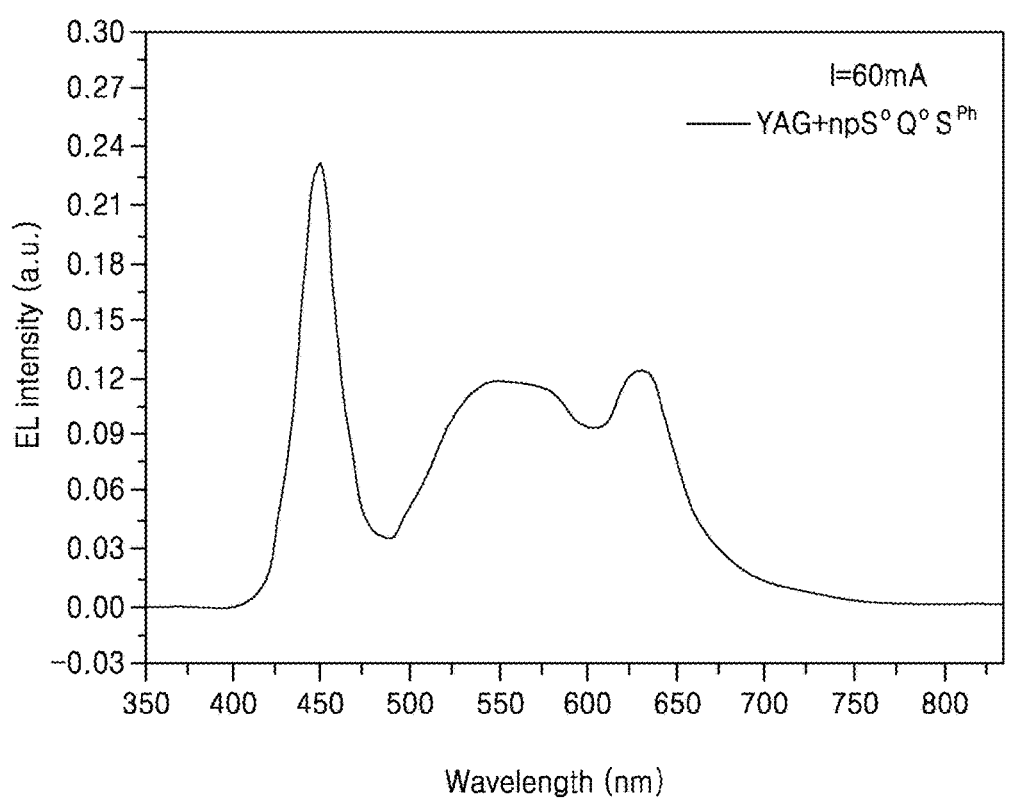
FIG. 10 is a graph showing electroluminescence spectrum obtained by applying electric current to a white LED that is prepared in Example 9.
Figure 11:
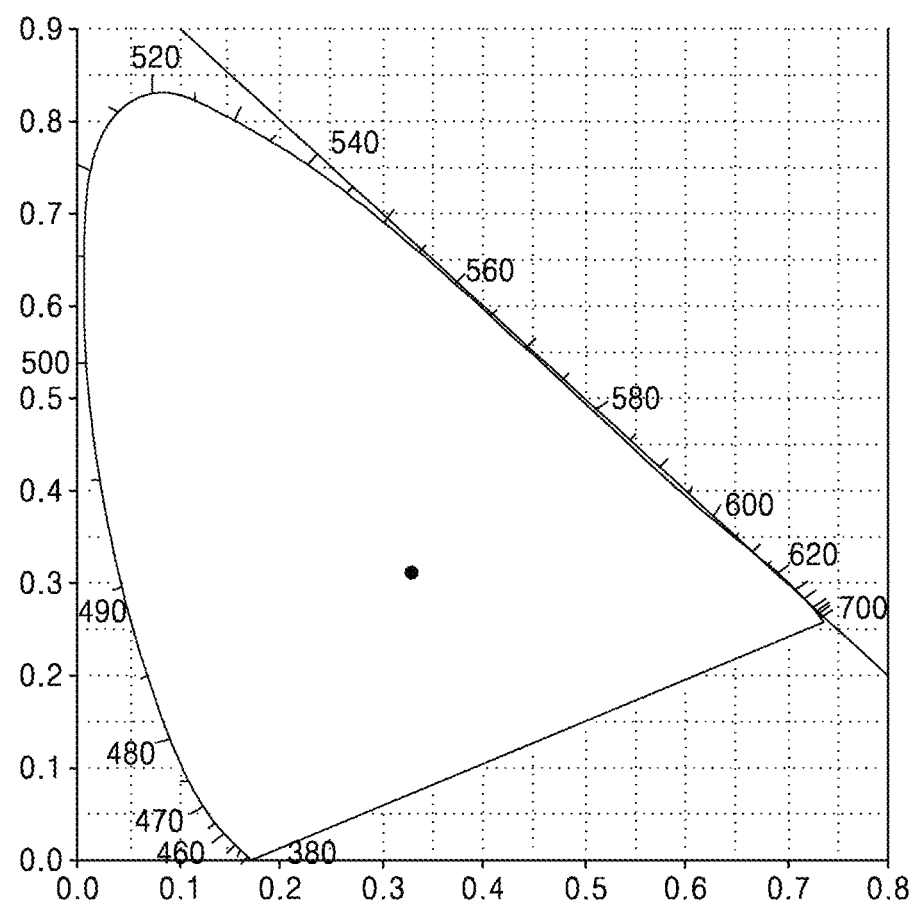
FIG. 11 shows color coordinates obtained by applying electric current to a white LED that is prepared in Example 9.

Referring to Table 1 and FIGS. 10 and 11, it was confirmed that the white LED of Example 9 exhibited the best performance, and compared to the standard white LED of Comparative Example 1 currently available on the market, the white LED of Example 9 had excellent CRI and slightly reduced luminous efficacy. Thus, it is considered that the performance of the white LED of Example 9 is good enough for commercialization.

TABLE 1

| LED | Weight ratio (Q1 emission spectrum at 620 nm and Q2 emission spectrum at 611 nm) | Color rendering index (CRI, Ra) | Color temperature (K) | Luminous efficacy (lm/W) |
| --- | --- | --- | --- | --- |
| Comparative Example 1 | Resin:YAG = 100:10 | 66 | 5913 | 63 |
| Comparative Example 2 | Resin:YAG:QD1:QD2 = 100:10:0.006:0.003 | 75 | 6302 | 38 |
| Example 5 | Resin:YAG:npSQ$_1$S:npSQ$_2$S = 100:10:0.50:0.25 | 86 | 4093 | 46 |
| Example 6 | Resin:YAG:npSQ$_1$S$^{Ph}$:npSQ$_2$S$^{Ph}$ = 100:10:0.50:0.25 | 87 | 3842 | 51 |
| Example 7 | Resin:YAG:npSQ$_1$S:npSQ$_2$S = 100:10:0.47:0.23 | 86 | 6537 | 46 |
| Example 8 | Resin:YAG:npSQ$_1$S$^{Ph}$:npSQ$_2$S$^{Ph}$ = 100:10:0.47:0.23 | 86 | 4521 | 55 |
| Example 9 | Resin:YAG:npSQ$_1$S$^{Ph}$:npSQ$_2$S$^{Ph}$ = 100:11:0.47:0.23 | 86 | 5526 | 60 |

As described above, according to the one or more of the above exemplary embodiments, in a nanostructured hybrid particle, light extraction may occur in all three-dimensional directions, and thus, the nanostructured hybrid particle may have high light extraction efficiency compared to light extraction occurring on a two-dimensional plane. In addition, a white LED having high CRI and luminous efficacy may be prepared by using the nanostructured hybrid particle.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A nanostructured hybrid particle, comprising:
a spherical hydrophobic base particle having a convex-concave nanopattern on a surface thereof;
a hydrophobic light-emitting nanoparticle disposed in a concave portion of the convex-concave nanopattern on the surface of the spherical hydrophobic base particle and
a core particle inside the spherical hydrophobic base particle;
wherein the core particle comprises a cluster of superparamagnetic nanoparticles; and
a shell surrounding the cluster wherein the shell comprising at least one selected from silica, alumina, titania, zirconia, and ceria.

2. The nanostructured hybrid particle of claim 1, wherein the base particle comprises at least one selected from silica, alumina, titania, zirconia, and ceria.

3. The nanostructured hybrid particle of claim 1, wherein the base particle comprises at least one hydrophobic functional group selected from a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_3$-$C_{20}$ heteroaryl group, a substituted or unsubstituted $C_4$-$C_{20}$ cycloalkyl group, and a substituted or unsubstituted $C_3$-$C_{20}$ heterocycloalkyl group on a surface thereof.

4. The nanostructured hybrid particle of claim 1, wherein the light-emitting nanoparticle comprises at least one selected from a semiconductor nanocrystal, an inorganic fluorophore, a fluorescent dye, and a transparent metal oxide doped with a dye.

5. The nanostructured hybrid particle of claim 1, wherein the light-emitting nanoparticle comprises at least one selected from a Group II-VI semiconductor nanocrystal, a Group III-V semiconductor nanocrystal, and an inorganic fluorophore.

6. The nanostructured hybrid particle of claim 1, wherein the light-emitting nanoparticle comprises at least one core/shell structure selected from:
(1) a Group II-VI semiconductor nanocrystal (core)/a Group II-VI semiconductor nanocrystal (shell),
(2) a Group III-V semiconductor nanocrystal (core)/a Group III-V semiconductor nanocrystal (shell), and
(3) a Group III-V semiconductor nanocrystal (core)/a Group II-VI semiconductor nanocrystal (shell).

7. The nanostructured hybrid particle of claim 5, wherein the Group II-VI semiconductor nanocrystal comprises at least one selected from CdS, CdSe, CdTe, ZnS, ZnSe, ZnTe, HgS, HgSe, and HgTe, the Group III-V semiconductor nanocrystal comprises at least one selected from GaN, GaP, GaAs, InP, and InAs, and the inorganic fluorophore comprises at least one selected from $La_2O_2S$:Eu, $Li_2Mg(MoO_4)$:Eu,Sm, $(Ba, Sr)_2SiO_4$:Eu, ZnS:Cu,Al, $SrGa_2S_4$:Eu, $Sr_5(PO_4)_3Cl$:Eu, $(SrMg)_5PO_4Cl$:Eu, $BaMg_2Al_{16}O_{27}$:Eu, $Na(Y,Gd,Ln)F_4$:(Yb,Er) (where Ln comprises at least one lanthanoid, except Yb and Er), and a core/shell structure of $Na(Y,Gd,Ln)F_4$: (Yb,Er)/$Na(Gd,L)F_4$:(Ce,Tb) (where L comprises at least one lanthanoid or Y, except Yb, Er, Ce, and Tb).

8. The nanostructured hybrid particle of claim 1, wherein the light-emitting nanoparticle comprises a hydrophobic ligand or a surfactant having a hydrophobic functional group on a surface thereof.

9. The nanostructured hybrid particle of claim 1, further comprising at least one metal nanoparticle selected from gold (Au), silver (Ag), iron (Fe), copper (Co), and nickel (Ni), in addition to the light-emitting nanoparticle in the concave portion of the convex-concave nanopattern.

10. The nanostructured hybrid particle of claim 1, further comprising a coating layer to cover the base particle and the light-emitting nanoparticle.

11. The nanostructured hybrid particle of claim 10, wherein the coating layer comprises a material having a smaller refractive index than that of the light-emitting nanoparticle and a greater refractive index than that of air.

12. The nanostructured hybrid particle of claim 11, wherein the material comprises at least one selected from silica, alumina, titania, zirconia, and ceria.

13. The nanostructured hybrid particle of claim 12, wherein the material is combined with at least one functional group selected from a substituted or unsubstituted $C_6$-$C_{20}$ aryl group, a substituted or unsubstituted $C_1$-$C_{20}$ alkyl group, a substituted or unsubstituted $C_2$-$C_{20}$ alkenyl group, and a substituted or unsubstituted $C_2$-$C_{20}$ alkynyl group.

14. The nanostructured hybrid particle of claim 13, wherein the functional group is combined with a surface of the coating layer.

15. The nanostructured hybrid particle of claim 1, wherein the superparamagnetic nanoparticles comprise at least one selected from FeO, $Fe_2O_3$, $Fe_3O_4$, $MnFe_2O_4$, $CoFe_2O_4$, $NiFe_2O_4$, Fe, Co, and Ni.

16. The nanostructured hybrid particle of claim 1, wherein a diameter of the nanostructured hybrid particle is from about 10 nm to about 10 μm.

17. A light-emitting diode (LED) comprising the nanostructured hybrid particle of claim 1.

18. A biosensor comprising the nanostructured hybrid particle of claim 1.

19. A bioassay kit comprising the nanostructured hybrid particle of claim 1.

20. A bio-imaging reagent comprising the nanostructured hybrid particle of claim 1.

* * * * *